United States Patent
Pendse

(10) Patent No.: US 8,574,959 B2
(45) Date of Patent: Nov. 5, 2013

(54) SEMICONDUCTOR DEVICE AND METHOD OF FORMING BUMP-ON-LEAD INTERCONNECTION

(75) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/960,178

(22) Filed: Dec. 3, 2010

(65) Prior Publication Data
US 2011/0074024 A1  Mar. 31, 2011

Related U.S. Application Data

(60) Continuation-in-part of application No. 12/472,236, filed on May 26, 2009, now Pat. No. 7,901,983, which is a continuation of application No. 12/062,293, filed on Apr. 3, 2008, now Pat. No. 7,700,407, which is a division of application No. 10/985,654, filed on Nov. 10, 2004, now Pat. No. 7,368,817.

(60) Provisional application No. 60/518,864, filed on Nov. 10, 2003, provisional application No. 60/533,918, filed on Dec. 31, 2003.

(51) Int. Cl.
*H01L 21/44* (2006.01)
*H01L 23/48* (2006.01)

(52) U.S. Cl.
USPC ........... 438/107; 438/108; 438/612; 438/613; 438/615; 257/734; 257/737; 257/778

(58) Field of Classification Search
USPC .......... 438/107, 108, 612–615; 257/734, 737, 257/778, E23.021
See application file for complete search history.

(56) References Cited

U.S. PATENT DOCUMENTS 5,378,859 A  1/1995  Shirasaki et al.
5,386,624 A  2/1995  George et al.
(Continued)

FOREIGN PATENT DOCUMENTS

JP  04-355933  9/1992
JP  6503687  4/1994
(Continued)

OTHER PUBLICATIONS

Yamada, Hiroshi et al., "Advanced copper column based solder bump for flip-chip interconnection", International Symposium on Microelectronics, 1997, pp. 417-422, The British Library—"The world's knowledge".

(Continued)

*Primary Examiner* — Hsien Ming Lee
(74) *Attorney, Agent, or Firm* — Robert D. Atkins; Patent Law Group: Atikins & Associates, P.C.

(57) ABSTRACT

A semiconductor device has a semiconductor die with a plurality of composite bumps formed over a surface of the semiconductor die. The composite bumps have a fusible portion and non-fusible portion, such as a conductive pillar and bump formed over the conductive pillar. The composite bumps can also be tapered. Conductive traces are formed over a substrate with interconnect sites having edges parallel to the conductive trace from a plan view for increasing escape routing density. The interconnect site can have a width less than 1.2 times a width of the conductive trace. The composite bumps are wider than the interconnect sites. The fusible portion of the composite bumps is bonded to the interconnect sites so that the fusible portion covers a top surface and side surface of the interconnect sites. An encapsulant is deposited around the composite bumps between the semiconductor die and substrate.

61 Claims, 25 Drawing Sheets

(56) References Cited

U.S. PATENT DOCUMENTS

| | | |
|---|---|---|
| 5,434,410 A | 7/1995 | Kulwicki |
| 5,508,561 A | 4/1996 | Tago et al. |
| 5,519,580 A | 5/1996 | Natarajan et al. |
| 5,650,595 A | 7/1997 | Bentlage et al. |
| 5,710,071 A | 1/1998 | Beddingfield et al. |
| 5,844,782 A | 12/1998 | Fukasawa |
| 5,869,886 A | 2/1999 | Tokuno |
| 5,872,399 A | 2/1999 | Lee |
| 5,889,326 A | 3/1999 | Tanaka |
| 5,915,169 A | 6/1999 | Heo |
| 5,985,456 A | 11/1999 | Zhou et al. |
| 6,201,305 B1 | 3/2001 | Darveaux et al. |
| 6,218,630 B1 | 4/2001 | Takigami |
| 6,228,466 B1 | 5/2001 | Tsukada et al. |
| 6,259,163 B1 | 7/2001 | Ohuchi et al. |
| 6,281,107 B1 * | 8/2001 | Moriyama .................... 438/613 |
| 6,281,450 B1 | 8/2001 | Urasaki et al. |
| 6,297,560 B1 | 10/2001 | Capote et al. |
| 6,324,754 B1 | 12/2001 | DiStefano et al. |
| 6,329,605 B1 | 12/2001 | Beroz et al. |
| 6,335,568 B1 | 1/2002 | Yuzawa et al. |
| 6,335,571 B1 | 1/2002 | Capote et al. |
| 6,383,916 B1 | 5/2002 | Lin |
| 6,396,707 B1 | 5/2002 | Huang et al. |
| 6,409,073 B1 | 6/2002 | Kaskoun et al. |
| 6,441,316 B1 | 8/2002 | Kusui |
| 6,448,665 B1 | 9/2002 | Nakasawa et al. |
| 6,458,622 B1 | 10/2002 | Keser et al. |
| 6,573,610 B1 | 6/2003 | Tsai |
| 6,600,234 B2 | 7/2003 | Kuwabara et al. |
| 6,608,388 B2 | 8/2003 | Lin et al. |
| 6,660,560 B2 | 12/2003 | Chaudhuri et al. |
| 6,678,948 B1 | 1/2004 | Benzler et al. |
| 6,710,458 B2 | 3/2004 | Seko |
| 6,734,557 B2 | 5/2004 | Taniguchi et al. |
| 6,774,497 B1 | 8/2004 | Qi et al. |
| 6,780,673 B2 | 8/2004 | Venkateswaran |
| 6,787,918 B1 | 9/2004 | Tsai et al. |
| 6,809,262 B1 | 10/2004 | Hsu |
| 6,818,545 B2 | 11/2004 | Lee et al. |
| 6,821,878 B2 | 11/2004 | Danvir et al. |
| 6,849,944 B2 | 2/2005 | Murtuza et al. |
| 6,870,276 B1 | 3/2005 | Moxham et al. |
| 6,888,255 B2 | 5/2005 | Murtuza et al. |
| 6,913,948 B2 | 7/2005 | Caletka et al. |
| 7,005,585 B2 | 2/2006 | Ishizaki |
| 7,005,750 B2 | 2/2006 | Liu |
| 7,049,705 B2 | 5/2006 | Huang |
| 7,057,284 B2 | 6/2006 | Chauhan et al. |
| 7,064,435 B2 | 6/2006 | Chung et al. |
| 7,098,407 B2 | 8/2006 | Kim et al. |
| 7,102,222 B2 | 9/2006 | Kuo et al. |
| 7,102,239 B2 | 9/2006 | Pu et al. |
| 7,173,828 B2 | 2/2007 | Lin et al. |
| 7,224,073 B2 | 5/2007 | Kim |
| 7,242,099 B2 | 7/2007 | Lin et al. |
| 7,271,484 B2 | 9/2007 | Reiss et al. |
| 7,294,929 B2 | 11/2007 | Miyazaki |
| 7,317,245 B1 | 1/2008 | Lee et al. |
| 7,405,484 B2 | 7/2008 | Usui et al. |
| 7,436,063 B2 | 10/2008 | Miyata et al. |
| 7,521,284 B2 | 4/2009 | Miranda et al. |
| 7,642,660 B2 | 1/2010 | Tay et al. |
| 7,670,939 B2 | 3/2010 | Topacio et al. |
| 7,671,454 B2 | 3/2010 | Seko |
| 7,732,913 B2 | 6/2010 | Hsieh et al. |
| 7,750,457 B2 | 7/2010 | Seko |
| 7,790,509 B2 | 9/2010 | Gerber |
| 7,791,211 B2 | 9/2010 | Chen et al. |
| 7,847,399 B2 | 12/2010 | Masumoto |
| 7,847,417 B2 | 12/2010 | Araki et al. |
| 7,851,928 B2 | 12/2010 | Gallegos et al. |
| 7,898,083 B2 | 3/2011 | Castro |
| 7,902,660 B1 | 3/2011 | Lee et al. |
| 7,902,678 B2 | 3/2011 | Ohuchi et al. |
| 7,902,679 B2 | 3/2011 | Lin et al. |
| 7,932,170 B1 | 4/2011 | Huemoeller et al. |
| 7,947,602 B2 | 5/2011 | Ito et al. |
| 2001/0013423 A1 | 8/2001 | Dalal et al. |
| 2002/0100610 A1 * | 8/2002 | Yasuda et al. .................. 174/260 |
| 2004/0056341 A1 | 3/2004 | Endo et al. |
| 2004/0210122 A1 * | 10/2004 | Sieburg .......................... 600/393 |
| 2004/0232562 A1 | 11/2004 | Hortaleza et al. |
| 2005/0103516 A1 | 5/2005 | Kaneyuki |
| 2005/0248037 A1 | 11/2005 | Hung et al. |
| 2006/0131758 A1 | 6/2006 | Dao |
| 2007/0200234 A1 | 8/2007 | Gerber et al. |
| 2008/0093749 A1 | 4/2008 | Gerber et al. |
| 2008/0179740 A1 | 7/2008 | Liao |
| 2008/0277802 A1 | 11/2008 | Tsai et al. |
| 2009/0108445 A1 | 4/2009 | Liang |
| 2009/0114436 A1 | 5/2009 | Chen et al. |
| 2009/0152716 A1 | 6/2009 | Sohara |
| 2009/0191329 A1 | 7/2009 | Wang |
| 2009/0288866 A1 | 11/2009 | Tsai et al. |
| 2009/0308647 A1 | 12/2009 | Liao |
| 2010/0139965 A1 | 6/2010 | Wang et al. |
| 2011/0049703 A1 | 3/2011 | Hsu et al. |

FOREIGN PATENT DOCUMENTS

| | | |
|---|---|---|
| JP | 09097791 | 4/1997 |
| JP | 10-256307 | 9/1998 |
| JP | 11145176 A | 5/1999 |
| JP | 11233571 A | 8/1999 |
| JP | 2000-031204 | 1/2000 |
| JP | 2001156203 A | 6/2001 |
| JP | 2002270732 A | 9/2002 |
| JP | 2004-221205 | 5/2004 |
| JP | 2005109187 A | 4/2005 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Lu, H. et al., "Predicting Optimal Process Conditions for Flip-Chip Assembly Using Copper Column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

* cited by examiner

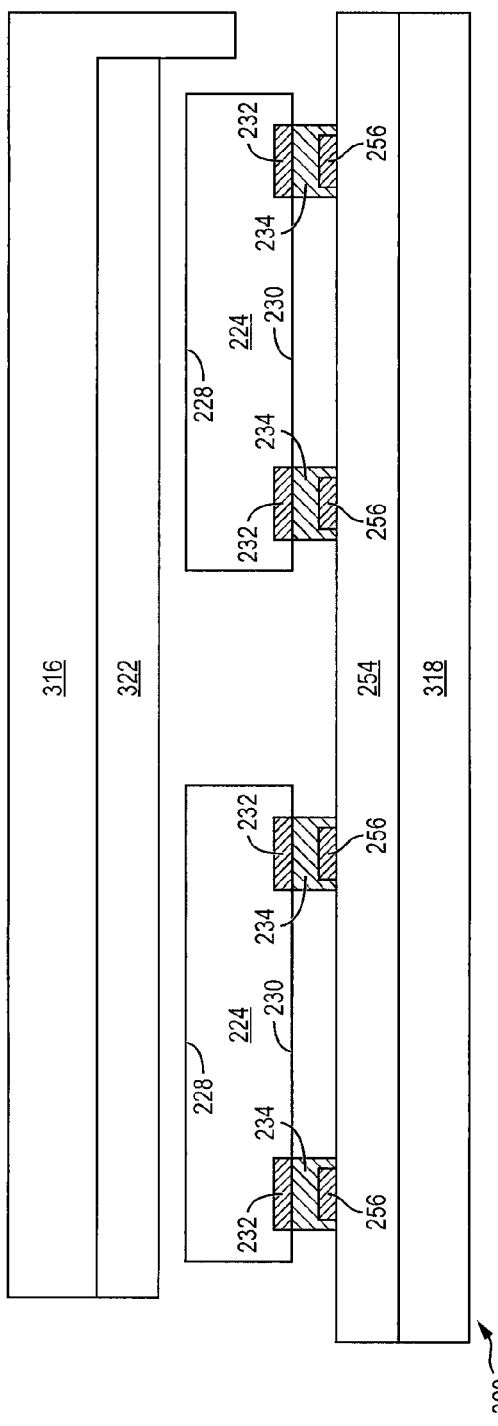
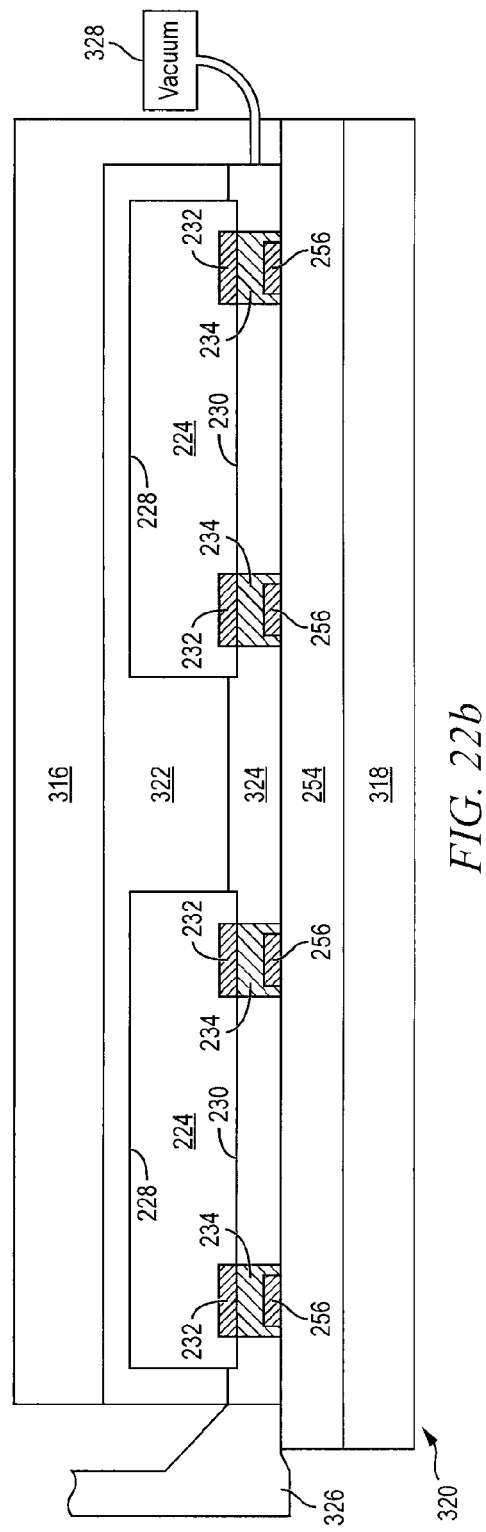

US 8,574,959 B2

SEMICONDUCTOR DEVICE AND METHOD OF FORMING BUMP-ON-LEAD INTERCONNECTION

CLAIM OF DOMESTIC PRIORITY

The present application is a continuation-in-part of application Ser. No. 12/472,236, now U.S. Pat. No. 7,901,983, filed May 26, 2009, which is a continuation of U.S. application Ser. No. 12/062,293, now U.S. Pat. No. 7,700,407, filed Apr. 3, 2008, which is a division of U.S. application Ser. No. 10/985,654, now U.S. Pat. No. 7,368,817, filed Nov. 10, 2004, which claims the benefit of U.S. Provisional Application No. 60/533,918, filed Dec. 31, 2003, and U.S. Provisional Application No. 60/518,864, filed Nov. 10, 2003.

FIELD OF THE INVENTION

The present invention relates in general to semiconductor devices and, more particularly, to a semiconductor device and method of forming a bump-on-lead interconnection.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

In conventional flipchip type packages, a semiconductor die is mounted to a package substrate with the active side of the die facing the substrate. Conventionally, the interconnection of the circuitry in the die with circuitry in the substrate is made by way of bumps which are attached to an array of interconnect pads on the die, and bonded to a corresponding complementary array of interconnect pads, often referred to as capture pads on the substrate.

The areal density of electronic features on integrated circuits has increased enormously, and semiconductor die having a greater density of circuit features also may have a greater density of sites for interconnection with the package substrate.

The package is connected to underlying circuitry, such as a printed circuit board or motherboard, by way of second level interconnects between the package and the underlying circuit. The second level interconnects have a greater pitch than the flipchip interconnects, and so the routing on the substrate conventionally fans out. Significant technological advances have enabled construction of fine lines and spaces. The space between adjacent pads limits the number of traces than can escape from the more inward capture pads in the array. The fan-out routing between the capture pads beneath the die and external pins of the package is conventionally formed on multiple metal layers within the package substrate. For a complex interconnect array, substrates having multiple layers can be required to achieve routing between the die pads and second level interconnects on the package.

Multiple layer substrates are expensive and, in conventional flipchip constructs, the substrate alone typically accounts for more than half the package cost. The high cost of multilayer substrates has been a factor in limiting proliferation of flipchip technology in mainstream products. The escape routing pattern typically introduces additional electrical parasitics because the routing includes short runs of unshielded wiring and vias between wiring layers in the signal transmission path. Electrical parasitics can significantly limit package performance.

The flipchip interconnection can be made by using a melting process to join the bumps, e.g., solder bumps, onto the mating surfaces of the corresponding capture pads, referred to as bump-on-capture pad (BOC) interconnect. Two features are evident in the BOC design: first, a comparatively large capture pad is required to mate with the bump on the die, and second, an insulating material, typically a solder mask, is required to confine the flow of solder during the interconnection process. The solder mask opening defines the contour of the melted solder at the capture pad, i.e. solder mask defined, or the solder contour may not be defined by the mask opening, i.e. non-solder mask defined. In the latter case, the solder mask opening is significantly larger than the capture pad. Since the techniques for defining solder mask openings have wide tolerance ranges for a solder mask defined bump configuration, the capture pad must be large, typically considerably larger than the design size for the mask opening, to ensure that the mask opening will be located on the mating surface of the pad. For a non-solder mask defined bump configuration, the solder mask opening must be larger than the capture pad. The width of capture pads or diameter can be as much as two to four times wider than the trace width. The larger width of the capture pads results in considerable loss of routing space on the top substrate layer. In particular, the escape routing pitch is much larger than the finest trace pitch that the substrate technology can offer. A significant number of pads must be routed on lower substrate layers by means of short stubs and vias, often beneath the footprint of the die, emanating from the pads in question.

In a typical example of a conventional solder mask defined BOC interconnection, the capture pad has a diameter about 140 μm, and the solder mask opening has a diameter about 90 μm, and the routing traces are about 25-30 μm wide. The diameter of the mating surface for attachment of the bump to the die pad, that is, the place of interface between the bump and the die pad, is defined by the solder mask opening as having a diameter about 90 μm.

Conventional BOC interconnect layouts are shown in FIGS. 1 and 2 as portions 10 and 20 of a flipchip package. The partial sectional view in FIG. 1 is taken in a plane parallel to the package substrate surface, along the line 1-1' in FIG. 2. The partial sectional view in FIG. 2 is taken in a plane perpendicular to the package substrate surface, along the line 2-2' in FIG. 1. Certain features are shown as if transparent, but many of the features in FIG. 1 are shown partly obscured by overlying features.

In FIGS. 1 and 2, a die attach surface of the package substrate includes a metal or layer formed on a dielectric layer over substrate 12. The metal layer is patterned to form traces or leads 13 and capture pads 14. An insulating layer or solder mask 16 covers the die attach surface of substrate 12. Solder mask 16 is usually a photo-definable material patterned by photoresist to leave the mating surfaces of capture pads 14 exposed. The interconnect bumps 15 attached to pads on the active side of semiconductor die 18 are joined to the mating surfaces of corresponding capture pads 14 on substrate 12 to form appropriate electrical interconnection between the circuitry on the die and the leads on the substrate. After the reflowed solder is cooled to establish the electrical connection, an underfill material 17 is introduced into the space between semiconductor die 18 and substrate 12 to mechanically stabilize the interconnects and protect the features between the die and substrate.

FIG. 1 shows signal escape traces 13 in the upper metal layer of substrate 12 routed from their respective capture pads 14 across the die edge location, indicated by broken line 11, and away from the die footprint. The signal traces 13 can have an escape pitch $P_E$ about 112 micrometers (μm). A 30 μm/30 μm design rule is typical for traces 13 in a configuration such as shown in FIG. 1. Traces 13 are nominally 30 μm wide and can be spaced as close together as 30 μm. The capture pads 14 are typically three times greater than the trace width, and the capture pads have a width or diameter nominally 90 μm. The openings in the solder mask are larger than the pads, having a nominal width or diameter of 135 μm.

FIGS. 1 and 2 show a non-solder mask defined solder contour. As the fusible material of the bumps on the die melt, the molten solder tends to wet the metal of the leads and capture pads and the solder tends to run out over any contiguous metal surfaces that are not masked. The solder tends to flow along the contiguous lead 13, and here the solder flow is limited by the solder mask at location 19 in FIG. 1. A non-solder mask defined solder contour at the pad is apparent in FIG. 2, in which portion 29 of bumps 15 is shown as having flowed over the sides of capture pads 14 and down to the surface of the dielectric layer of substrate 12. The non-solder mask defined contour does not limit the flow of solder over the surface and down over the sides of the capture pads and, unless there is a substantial excess of solder at the pad, the flow of solder is limited by the fact that the dielectric surface of the substrate is typically not wettable by the molten solder. A lower limit on the density of the capture pads in the arrangement shown in FIG. 1 is determined by, among other factors, the capacity of the mask forming technology to make reliable narrow mask structures and the need to provide mask structures between adjacent mask openings. A lower limit on the escape density is additionally determined by, among other factors, the need for escape lines from more centrally located capture pads to be routed between more peripherally located capture pads.

FIG. 3 shows a solder mask defined solder contour, in a sectional view similar to FIG. 2. Semiconductor die 38 is shown affixed by way of bumps 35 onto the mating surfaces of capture pads 34 formed along with traces or leads 33 by patterning a metal layer on the die attach side of a dielectric layer of substrate 32. After the reflowed solder is cooled to establish the electrical connection, an underfill material 37 is introduced into the space between die 38 and substrate 32 to mechanically stabilize the interconnects and protect the features between the die and substrate. Here, capture pads 34 are wider than in the example of FIGS. 1 and 2, and the solder mask openings are smaller than the capture pads, so that the solder mask material covers the sides and part of the mating surface of each capture pad, as shown at location 39, as well as leads 33. When bumps 35 are brought into contact with the mating surfaces of the respective capture pads 34, and then melted, solder mask material 36 restricts the flow of the molten solder, so that the shapes of the solder contours are defined by the shapes and dimensions of the mask openings over capture pads 34.

SUMMARY OF THE INVENTION

A need exists to minimize the interconnect sites on a substrate to increase routing density without impacting electrical functionality or manufacturing reliability. Accordingly, in one embodiment, the present invention is a method of making a semiconductor device comprising the steps of providing a semiconductor die having a plurality of composite bumps formed over a surface of the semiconductor die, providing a substrate, and forming a plurality of conductive traces over the substrate with interconnect sites having edges parallel to the conductive trace from a plan view for increasing escape routing density. The composite bumps have a fusible portion and non-fusible portion. The composite bumps are wider than the interconnect sites. The method further includes the steps of bonding the fusible portion of the composite bumps to the interconnect sites so that the fusible portion covers a top surface and side surface of the interconnect sites, and depositing an encapsulant around the composite bumps between the semiconductor die and substrate.

In another embodiment, the present invention is a method of making a semiconductor device comprising the steps of providing a semiconductor die, providing a substrate, forming a plurality of conductive traces over the substrate with interconnect sites having edges parallel to the conductive trace from a plan view for increasing escape routing density, forming a plurality of interconnect structures between the semiconductor die and the interconnect sites on the substrate, bonding the interconnect structures to the interconnect sites so that the interconnect structures cover a top surface and side surface of the interconnect sites, and depositing an encapsulant between the semiconductor die and substrate.

In another embodiment, the present invention is a method of making a semiconductor device comprising the steps of providing a semiconductor die, providing a substrate, forming a plurality of conductive traces over the substrate with interconnect sites having edges parallel to the conductive trace from a plan view for increasing escape routing density, forming a plurality of interconnect structures between the semiconductor die and the interconnect sites on the substrate, and bonding the interconnect structures to the interconnect sites so that the interconnect structures cover a top surface and side surface of the interconnect sites.

In another embodiment, the present invention is a semiconductor device comprising a semiconductor die. A plurality of conductive traces is formed over a substrate with interconnect sites having edges parallel to the conductive trace from a plan view for increasing escape routing density. A plurality of interconnect structures is formed between the semiconductor die and the interconnect sites on the substrate. The interconnect structures are bonded to the interconnect sites. An encapsulant is deposited between the semiconductor die and substrate.

BRIEF DESCRIPTION OF THE DRAWINGS

FIGS. 22a-22c illustrate mold underfill between the semiconductor die and substrate;

DETAILED DESCRIPTION OF THE DRAWINGS

Figures 1, 2, 3:
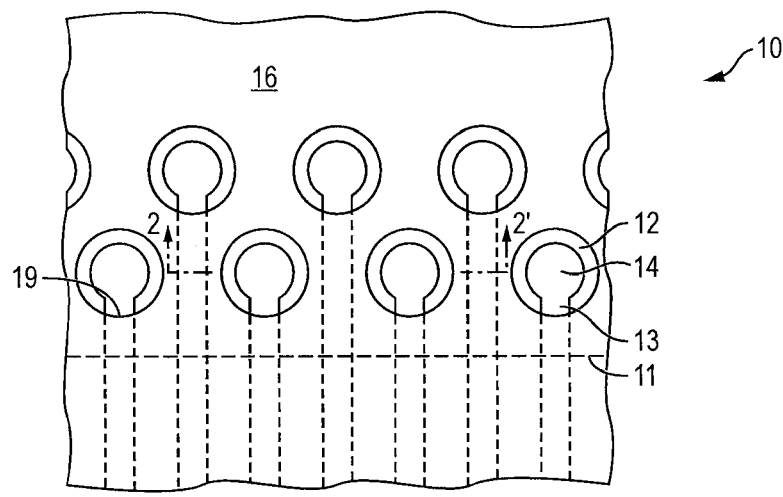
FIG. 1 illustrates a conventional bump-on-capture pad flipchip interconnection parallel to the plane of the package substrate surface.
FIG. 2 illustrates the conventional bump-on-capture pad flipchip interconnection perpendicular to the plane of the package substrate surface.
FIG. 3 illustrates a portion of another conventional bump-on-capture pad flipchip interconnection perpendicular to the plane of the package substrate surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 4:
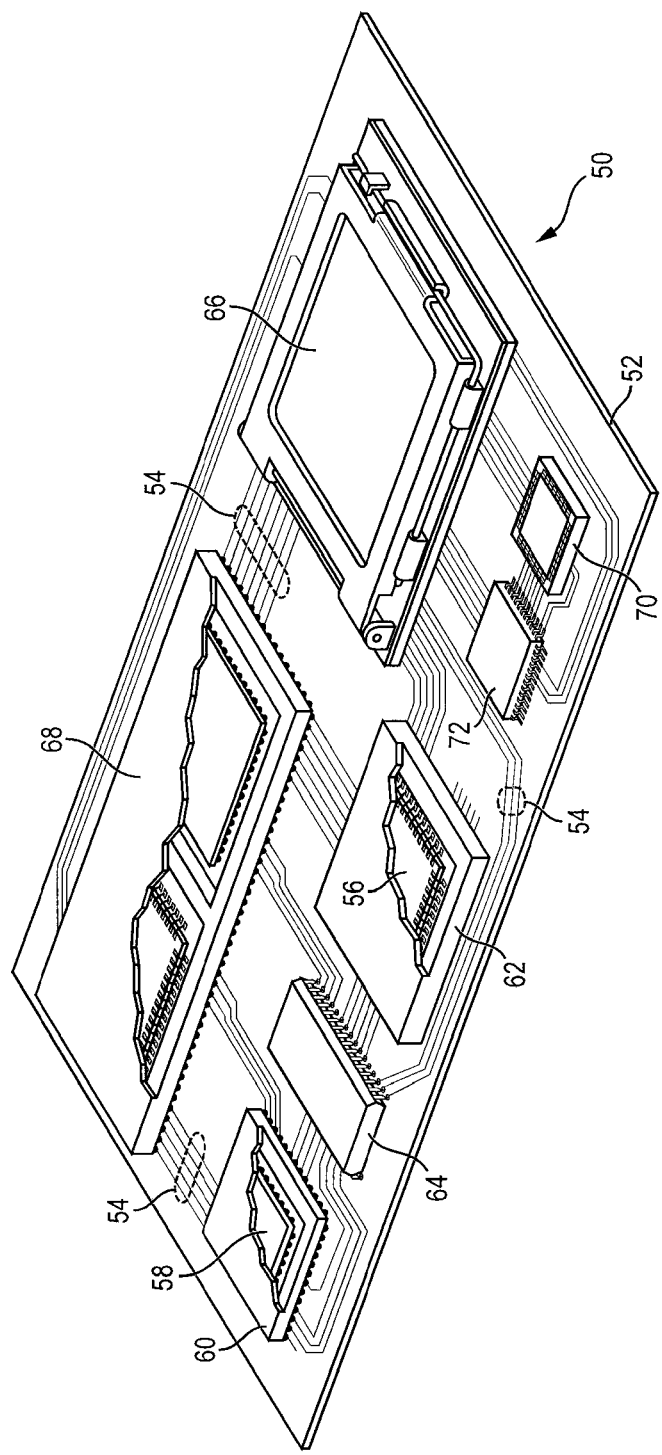
FIG. 4 illustrates a PCB with different types of packages mounted to its surface.

FIG. 4 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 4 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 4, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 5A:
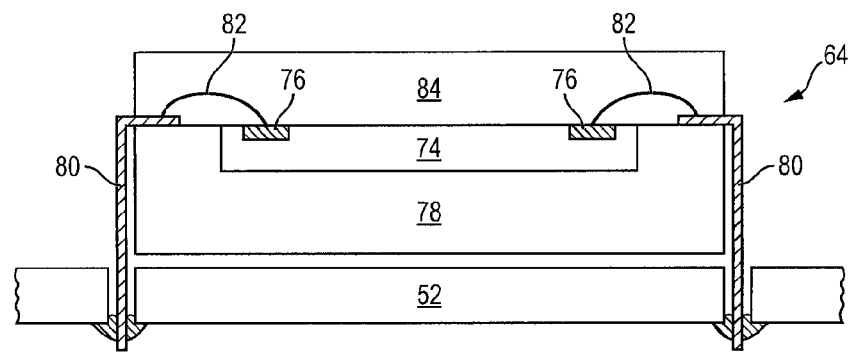
FIGS. 5a-5c illustrate further detail of the representative semiconductor packages mounted to the PCB.
Figure 5B:
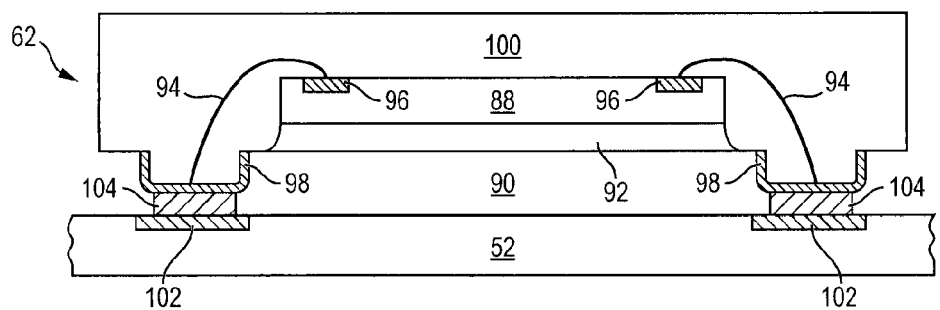
Figure 5C:
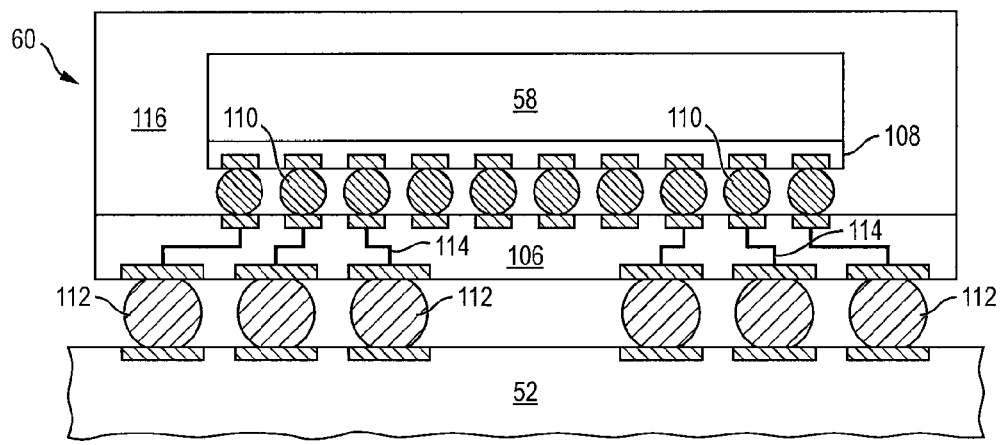

FIGS. 5a-5c show exemplary semiconductor packages. FIG. 5a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 5b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 5c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

In a flipchip type semiconductor die, the interconnect is accomplished by connecting the interconnect bump directly onto a narrow interconnection pad rather than onto a conventional capture pad. The width of the narrow pad is selected according to the base diameter of the interconnect bump that is to be connected onto the narrow pad. Particularly, the width of the narrow pad is less than the base diameter of the interconnect bump, e.g. in a range about 20% to about 80%. The present flipchip interconnect provides more efficient routing of traces on the substrate. The signal routing can be formed entirely in a single metal layer of the substrate to reduce the number of layers in the substrate. Forming the signal traces in a single layer permits relaxation of some of the via, line, and space design rules that the substrate must meet. The simplification of the substrate greatly reduces the overall cost of the flipchip package. The bump-on-narrow-pad (BONP) architecture also helps eliminate such features as vias and stubs from the substrate design and enables a microstrip controlled impedance electrical environment for signal transmission, thereby improving performance.

The flipchip interconnection has bumps attached to interconnect pads on a die and mated onto corresponding narrow interconnection pads on a substrate. A flipchip package includes a die having bumps attached to interconnect pads in an active surface, and a substrate having narrow interconnection pads in a die attach surface, in which the bumps are mated onto the narrow pads. The BONP interconnection is formed without use of a solder mask to confine the molten solder during a re-melt stage in the process and avoid the need for a solder mask which allows for finer interconnection geometry.

Figure 6:
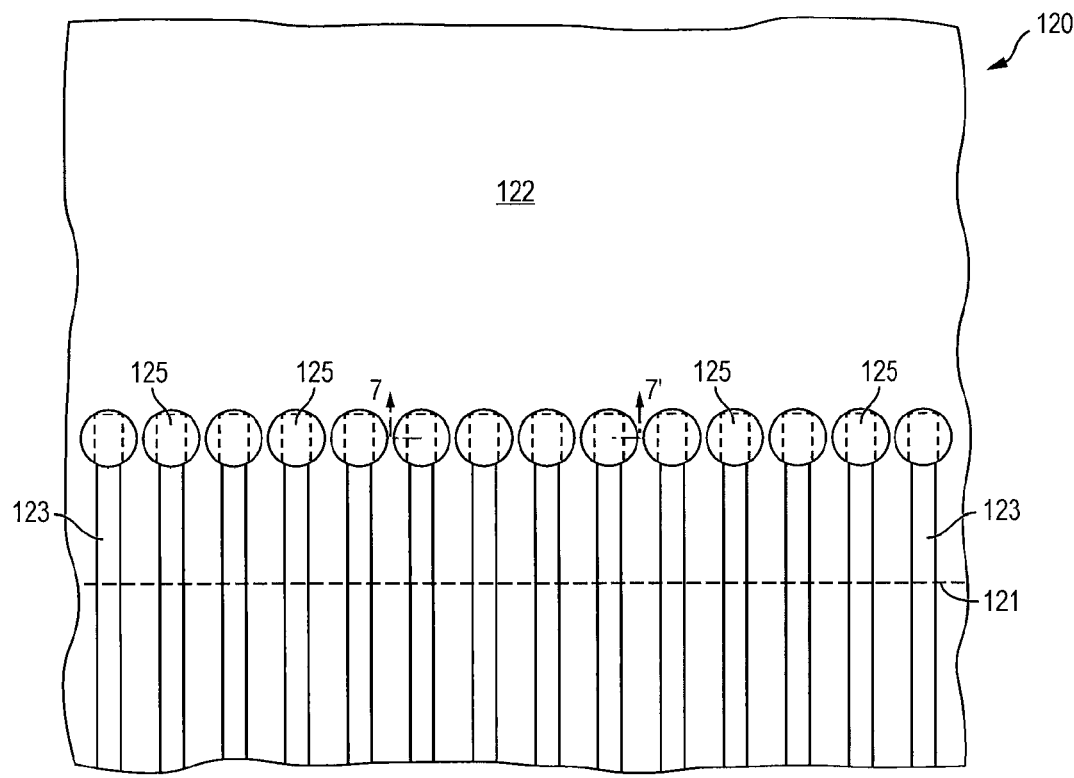
FIG. 6 illustrates a BOL flipchip interconnection parallel to the plane of the package substrate surface.
Figure 7:
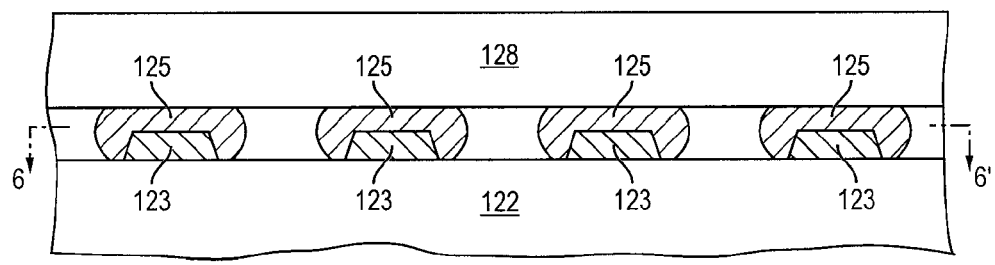
FIG. 7 illustrates the BOL flipchip interconnection of FIG. 6 perpendicular to the plane of the package substrate surface.
Figure 8:
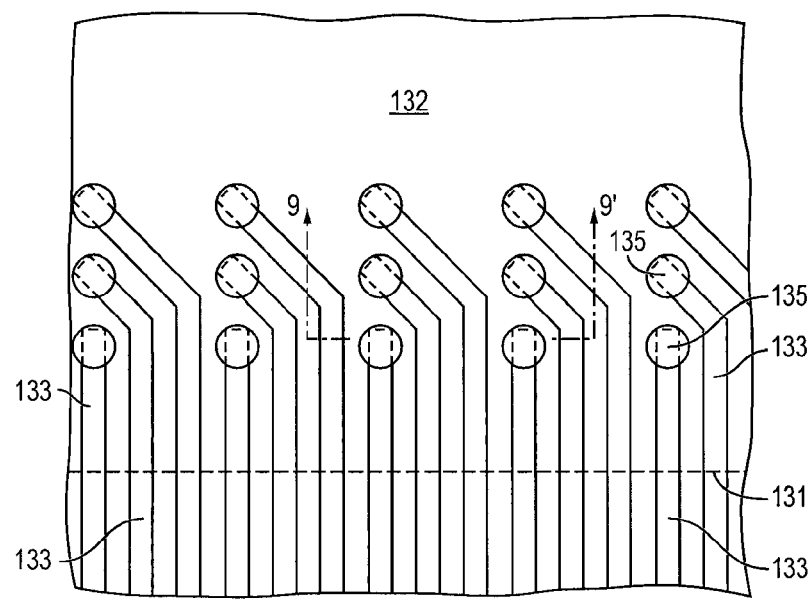
FIG. 8 illustrates a second BOL flipchip interconnection parallel to the plane of the package substrate surface.
Figure 9:
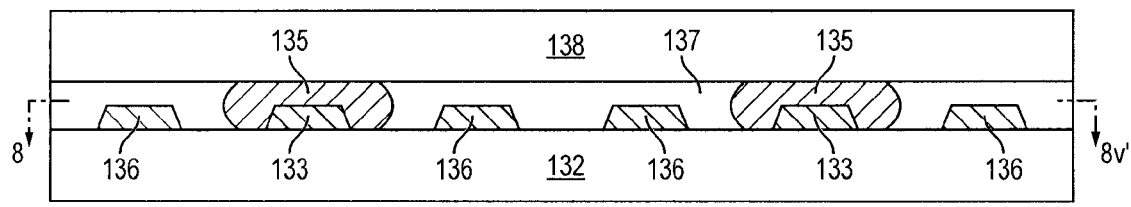
FIG. 9 illustrates the BOL flipchip interconnection of FIG. 8 perpendicular to the plane of the package substrate surface.

FIGS. 6 and 7 each show, in relation to FIGS. 4 and 5a-5c, a portion of a bump-on-lead (BOL) flipchip interconnection, in a diagrammatic partial sectional view taken in a plane parallel to the substrate surface, along the lines 7-7' and 6-6' in FIGS. 6 and 7, respectively. Certain features are shown as if transparent. The interconnection is achieved by mating the bumps directly onto respective narrow leads or traces on the substrate, referred to as a BOL interconnect. Solder mask materials typically cannot be resolved at such fine geometries and no solder mask is used. Instead, the function of confining molten solder flow is accomplished without a solder mask in the course of the assembly process. FIG. 7 shows a partial sectional view of a package as in FIG. 6, taken in a plane perpendicular to the plane of the package substrate surface, along the line 7-7' in FIG. 6. FIG. 8 shows a partial sectional view of a package as in FIG. 9, taken in a plane perpendicular to the plane of the package substrate surface, along the line 8-8' in FIG. 9. FIG. 9 shows a partial sectional view of a package as in FIG. 8, taken in a plane perpendicular to the plane of the package substrate surface, along the line 9-9' in FIG. 8.

The escape routing patterns for BOL substrates are shown in FIGS. 6 and 8. In FIG. 6, the escape routing patterns are arranged for semiconductor die 120 on which the die attach pads for the interconnect balls are formed in a row near the die perimeter. Bumps 125 are mated onto corresponding interconnect sites on escape traces 123 in a row near the edge of the die footprint, indicated by broken line 121. In FIG. 8, the escape routing patterns are arranged for a semiconductor die on which the die attach pads are located in an array of parallel rows near the die perimeter. Bumps 135 are mated onto corresponding interconnect sites on escape traces 133 in a complementary array near the edge of the die footprint, indicated by broken line 131.

As FIGS. 6 and 8 illustrate, the routing density achievable using BOL interconnect can equal the finest trace pitch offered by the substrate technology. In one embodiment, a width of the interconnect site on the trace is less than 1.2 times a width of the trace. The routing density is significantly higher than is achieved in a conventional BOC arrangement, as described in FIGS. 1-3. Conventional capture pads are typically two to four times as wide as the trace or lead width.

The BOL arrangement poses a challenge for the assembly process because the bumping and bonding pitch must be very fine. In the perimeter array version of BOL of FIG. 8, the bumps are arranged on an area array providing greater space for a larger bumping and bonding pitch and relieving the technological challenges for the assembly process. Even in the array embodiments, the routing traces on the substrate are at the same effective pitch as in the perimeter row arrangement. The array arrangement relieves the burden of fine pitch bumping and bonding without sacrificing the fine escape routing pitch advantage.

FIGS. 6 and 7 show traces or leads 123 formed by patterning a metal layer on a die attach surface of substrate dielectric layer 122. The electrical interconnection of semiconductor die 128 is made by joining bumps 125 on the die directly onto leads 123. Similarly, FIGS. 8 and 9 show traces or leads 133 formed by patterning a metal layer on a die attach surface of substrate dielectric layer 132. The signal escape traces are routed across the die edge location, indicated by broken line 131, and away from the die footprint. The electrical interconnection of semiconductor die 138 is made by joining bumps 135 on the die directly onto leads 133. Escape traces 136 are routed across the die edge location from interconnect sites in rows toward the interior of the die footprint, passing between bumps 135 on more peripheral rows of interconnect sites.

The BOL interconnection structure of FIGS. 6, 7, 8, and 9 can be produced by any of several methods, not requiring a solder mask. In the no solder mask implementation, interconnect bumps are affixed onto interconnect pads on the active side of the die. An upper die attach surface of the substrate has an upper metal layer patterned to provide the traces as appropriate for interconnection with the arrangement of bumps on the particular die. Because no capture pads are required, the patterned traces or leads need only route through sites corresponding to a pattern complementary to the arrangement of bumps on the die. In one embodiment, an encapsulating resin adhesive is employed to confine the solder flow during a melt phase of the interconnection process.

Figure 10:
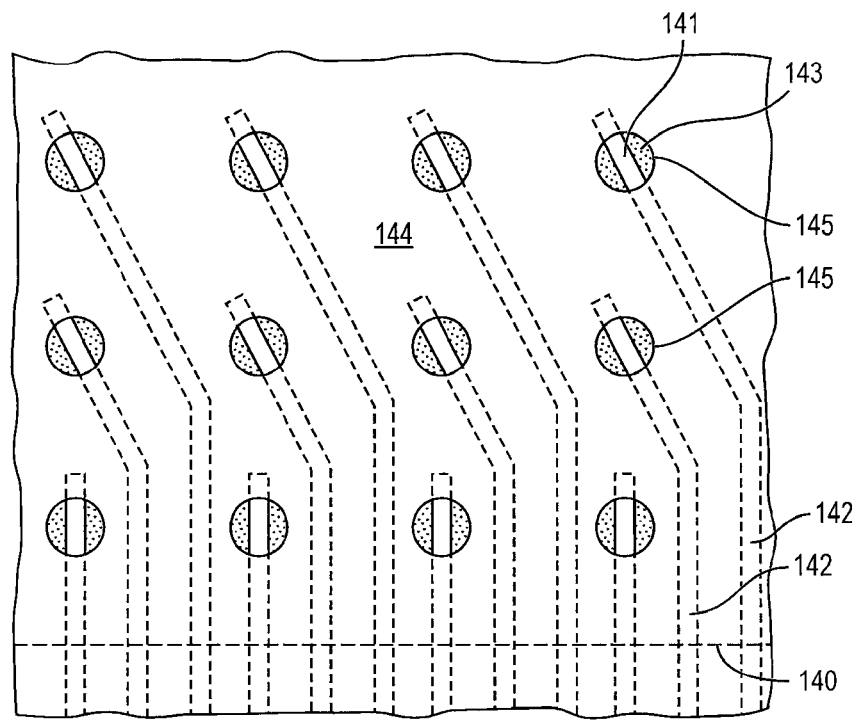
FIG. 10 illustrates a third BOL flipchip interconnection parallel to the plane of the package substrate surface.
Figure 11:
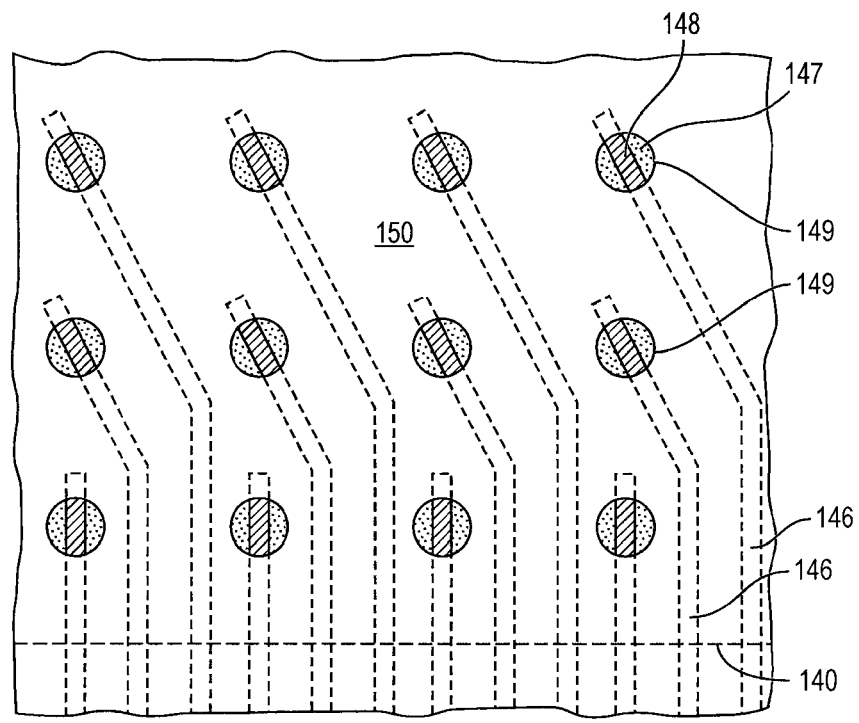
FIG. 11 illustrates a fourth BOL flipchip interconnection parallel to the plane of the package substrate surface.

FIGS. 10 and 11 show two examples of a portion of a BOL flipchip interconnection in a diagrammatic sectional view taken in a plane parallel to the substrate surface. Certain features are shown as if transparent. In this case, solder mask 144 is provided, which can have a nominal mask opening diameter in the range about 80 µm to 90 µm. Solder mask materials can be resolved at such pitches and, particularly, substrates can be made comparatively inexpensively with solder masks having 90 µm openings and having alignment tolerances plus or minus 25 µm. In some embodiments, a laminate substrate is used, such as four metal layer laminates. The traces can be at approximately 90 µm pitch and the interconnection sites can be in a 170 µm area array, providing an effective escape pitch approximately 90 µm across the edge of the die footprint, indicated by broken line 140.

In FIG. 10, the electrical interconnect is achieved by mating the bumps directly onto interconnect site 141 on a narrow lead or trace 142 patterned on a dielectric layer on the die attach surface of substrate 143. In one embodiment, a width of interconnect site 141 is less than 1.2 times a width of trace 142. There is no pad and solder mask 144 that serves to limit flow of bump material within the bounds of mask openings 145, preventing bump material flow away from interconnect site 141 along the wettable lead 142. The solder mask additionally confines flow of molten bump material between leads.

In FIG. 11, narrow leads or traces 146 are patterned on a dielectric layer on the die attach surface of substrate 147. In one embodiment, solder paste is deposited on interconnect sites 148 of leads 146 to provide a fusible medium for the interconnect. The openings 149 in solder mask 150 serve to define the paste. The paste is dispensed, reflowed, and coined if necessary to provide uniform surfaces to meet the bumps. The solder paste can be applied in the course of assembly using a substrate as described above with reference to FIG. 10. Alternatively, a substrate can be provided with paste suitably patterned prior to assembly. Other approaches to applying solder selectively to the interconnect sites can be employed in the solder-on-lead embodiments, including electroless plating and electroplating techniques. The solder-on-lead configuration provides additional solder volume for the interconnect, and can accordingly provide higher product yield, and can also provide a higher die standoff.

Accordingly, in some embodiments the solder-on-lead configuration is employed for interconnection of a die having high-melting temperature bumps, such as a high-lead solder, used for interconnection with ceramic substrates, onto an organic substrate. The solder paste can be selected to have a melting temperature low enough that the organic substrate is not damaged during reflow. To form the interconnect in such embodiments, the high-melting interconnect bumps are contacted with the solder-on-lead sites, and the remelt fuses the solder-on-lead to the bumps. Where a non-collapsible bump is used, together with a solder-on-lead process, no preapplied adhesive is required, as the displacement or flow of the solder is limited by the fact that only a small quantity of solder is present at each interconnect, and the non-collapsible bump prevents collapse of the assembly. In other embodiments, the solder-on-lead configuration is employed for interconnection of a die having eutectic solder bumps.

Figure 12A:
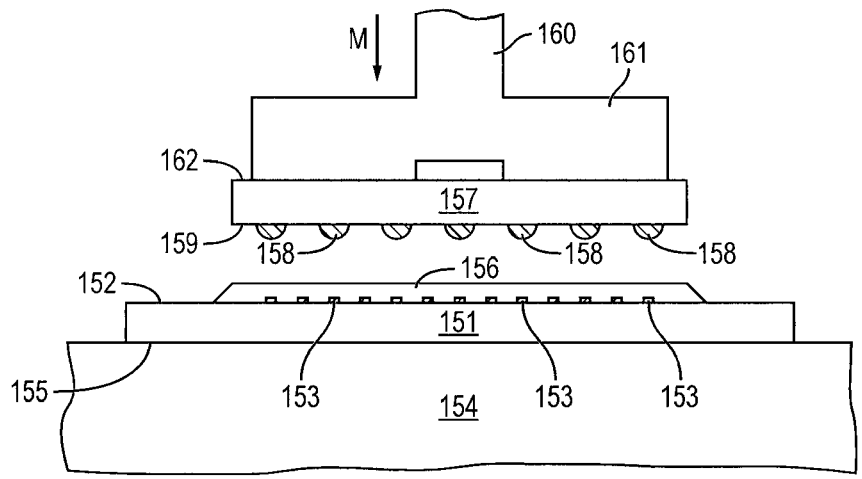
FIGS. 12a-12c illustrate a process for making the BOL flipchip interconnection.
Figure 12B:
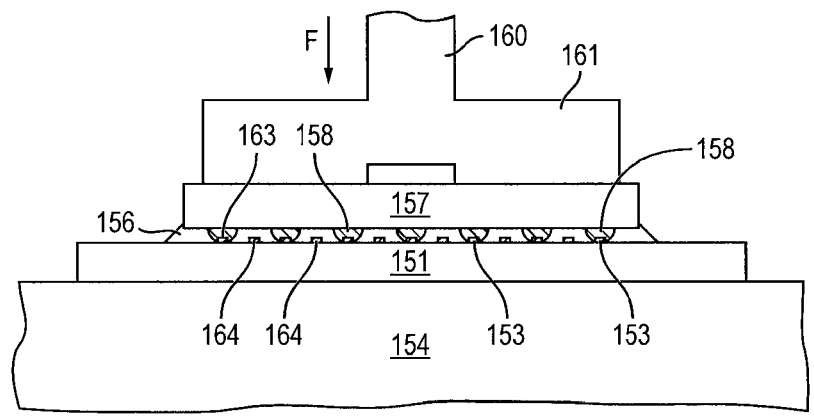
Figure 12C:
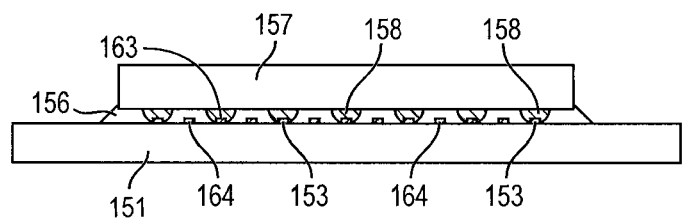

One embodiment for making a BOL interconnection is shown diagrammatically in FIGS. 12a-12c. In FIG. 12a, substrate 151 has a dielectric layer and metal layer on die attach surface 152. The metal layer is patterned to provide circuitry, particularly traces or leads 153 having sites for interconnection, on the die attach surface. Substrate 151 is supported on a carrier or stage 154, with a substrate surface 155 opposite die attach surface 152 facing the support. A quantity of encapsulating resin 156 is dispensed over die attach surface 152 of substrate 151, covering the interconnect sites on leads 153. Semiconductor die 157 has bumps 158 attached to die pads on active side 159. Bumps 158 include a fusible material which contacts the mating surfaces of leads 153. A pick-and-place tool 160 including chuck 161 picks up semiconductor die 157 by contact of the chuck with backside 162 of the die. Using pick-and-place tool 160, semiconductor die 157 is positioned facing substrate 152 with the active side of the die toward the die attach surface of substrate 151. Semiconductor die 157 and substrate 151 are aligned and moved one toward the other, as shown by arrow M, so that bumps 158 contact the corresponding interconnect sites on traces or leads 153 on the substrate. A force F is applied to press bumps 158 onto mating surfaces 163 at the interconnect sites on leads 153, as shown in FIG. 12b. The force must be sufficient to displace adhesive 156 from between bumps 158 and mating surfaces 163 at the interconnect sites on leads 153. Bumps 158 can be deformed by the force F, breaking the oxide film on the contacting surface of the bumps and/or on the mating surface of leads. The deformation of bumps 158 cause the fusible material of the bumps to be pressed onto the top and over the edges of lead 153. Adhesive 156 is partially cured by heating to a selected temperature. At this stage, adhesive 156 need only be partially cured, that is, only to an extent sufficient subsequently to prevent flow of molten solder along an interface between the adhesive and conductive traces 153. The fusible material of bumps 158 is melted and then is re-solidified, forming a metallurgical interconnection between the bump and lead 153. Adhesive 156 is cured to complete the die mount and secure the electrical interconnection at the mating surface 163, as shown in FIG. 12c. An electrical interconnection is thus formed between bumps 158 and corresponding interconnect sites on leads 153 in a configuration similar to FIG. 8. Other leads 164 are interconnected at other localities, which would be visible in other sectional views. The curing of adhesive 156 can be completed prior to, or concurrently with, or following melting the solder. Typically, adhesive 156 is a thermally curable adhesive, and the extent of curing at any phase in the process is controlled by regulating the temperature. The components can be heated and cured by raising the temperature of the chuck on the pick and place tool, or by raising the temperature of the substrate support.

Figure 13A:
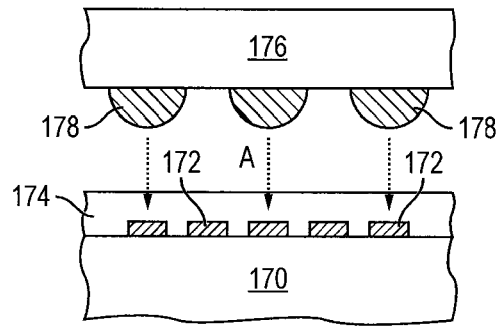
FIGS. 13a-13d illustrate further detail of the process for making the BOL flipchip interconnection.
Figure 13B:
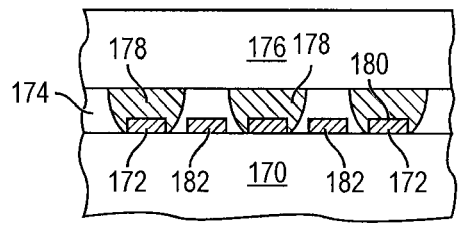
Figure 13C:
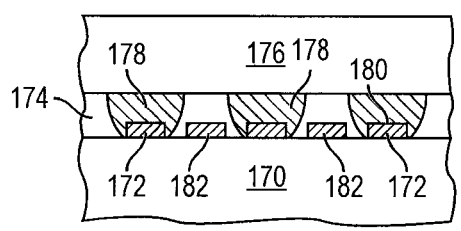
Figure 13D:
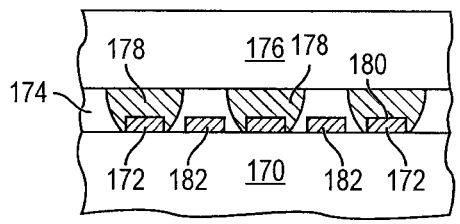

The process is shown in further detail in FIGS. 13a-13d. In FIG. 13a, substrate 170 has a die attach surface with conductive traces 172, and the interconnect sites on the traces are covered with adhesive 174. Semiconductor die 176 is positioned in relation to substrate 170 such that the active side of the die faces the die attach side of substrate 170, and is aligned by arrows A, such that bumps 178 on the die are aligned with corresponding mating surfaces on traces 172. Semiconductor die 176 and substrate 170 are moved toward one another so that the bumps contact the respective mating surfaces on the traces. In FIG. 13b, a force is applied to move bumps 178 and traces 172 against one another, displacing adhesive 174, and deforming the bumps onto mating surfaces 180 and over the edges of the traces. Deformation of bumps 178 on traces 172 breaks the oxide film on the contact surfaces of the bumps and the mating surfaces of the traces and establish a good electrical connection. The deformation of bumps 178 over the edges of traces 172 helps establish a good temporary mechanical connection. The interconnect sites of traces 182 are out of the plane of FIG. 13b. Heat is applied to partially cure adhesive 174 in FIG. 13c. Additional heat is applied to raise the temperature of bumps 178 sufficiently to cause the fusible material of the bumps to melt and complete the cure of adhesive 174, as shown in FIG. 13d. A metallurgical interconnection of bumps 178 is thus formed onto mating surfaces 180 at the interconnect sites on leads 172. The cured adhesive stabilizes the die mount.

In an alternative embodiment, the adhesive can be pre-applied to the die surface or to the bumps on the die surface, rather than to the substrate. The adhesive can be pooled in a reservoir. The active side of the die can be dipped in the pool and removed, so that a quantity of the adhesive is carried on the bumps. Using a pick-and-place tool, the die is positioned facing a supported substrate with the active side of the die toward the die attach surface of the substrate. The die and substrate are aligned and moved one toward the other so that the bumps contact the corresponding traces or leads on the substrate. Such a method is described in U.S. Pat. No. 6,780, 682, which is hereby incorporated by reference. The process of forcing, curing, and melting are carried out as described above.

Figure 14:
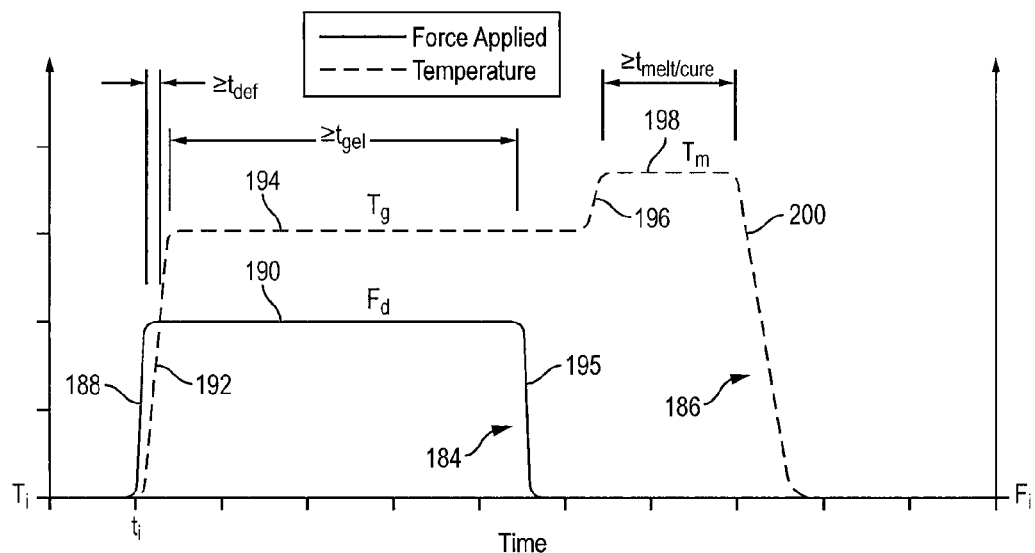
FIG. 14 illustrates a force or temperature schedule for a process for making the BOL flipchip interconnection.

A force or temperature schedule for the process is shown diagrammatically in FIG. 14. The process can use force, or temperature, or both. Time runs from left to right on the horizontal axis. A force profile 184 is shown as a thick solid line, and a temperature profile 186 is shown as a dotted line. The temperature profile begins at a temperature in the range of 80-90° C. The force profile begins at essentially zero force. Beginning at an initial time $t_i$, the force is rapidly increased from $F_i$ to a displacement/deformation force $F_d$ during portion 188 and held at that force for a time during portion 190. The force $F_d$ is sufficient to displace the adhesive away from between the bumps and the mating surfaces of the leads. The force $F_d$ is sufficient to deform the fusible portion of the bumps onto the mating surface, breaking the oxide film, and forming a good metal-to-metal contact. In some embodiments, the bumps flow over the edges of the leads to establish a mechanical interlock of the bumps and narrow pads, referred to as creep deformation. The total amount of force required depends upon the bump material and dimensions and upon the number of bumps.

The temperature is also rapidly increased from an initial temperature $T_i$ to a gel temperature $T_g$ during portion 192. The gel temperature $T_g$ is a temperature sufficient to partially cure the adhesive to a gel. The temperature ramps are set so that there is a short lag time $t_{def}$ following the moment when $F_d$ is reached and before $T_g$ is reached, long enough to permit the elevated force to displace the adhesive and to deform the bumps before the partial cure of the adhesive commences. The assembly is held during portion 190 and 194 at the displacement/deformation pressure $F_d$ and at the gel temperature $T_g$ for a time $t_{gel}$ sufficient to effect the partial cure of the adhesive. The adhesive should become sufficiently firm that it can subsequently maintain a good bump profile during the solder remelt phase, that is, sufficiently firm to prevent undesirable displacement of the molten fusible material of the bump or flow of the molten fusible material along the leads.

Once the adhesive has partially cured to a sufficient extent, the pressure can be ramped down rapidly during portion 195 to substantially no force or just the weight of the components. The temperature is then rapidly raised further during portion 196 to a temperature $T_m$ sufficient to remelt the fusible portions of the bumps, and the assembly is held during portion 198 at the remelt temperature $T_m$ for a time $t_{melt/cure}$ sufficient to fully form the solder remelt on the traces, and preferably sufficient to substantially, though not necessarily fully, cure the adhesive. The temperature is ramped down during portion 200 to the initial temperature $T_i$ and eventually to ambient. The process outlined in FIG. 14 can run its course over a time period of 5-10 seconds.

The adhesive in FIG. 14 can be a no-flow underfill material. In some approaches to flipchip interconnection, the metallurgical interconnection is formed first, and then an underfill material is flowed into the space between the die and the substrate. The no-flow underfill material is applied before the semiconductor die and substrate are brought together, and the no-flow underfill material is displaced by the approach of the bumps onto the leads, and by the opposed surfaces of the die and the substrate. The adhesive for the no-flow underfill material is a fast-gelling adhesive, that is, a material that gels sufficiently at the gel temperature in a time period in the order of 1-2 seconds. The materials for the no-flow underfill adhesive include non-conductive pastes.

Alternative bump structures, such as composite bumps, can be employed in the BOL interconnects. Composite bumps have two portions, made of different bump materials, including one which is collapsible under reflow conditions, and one which is substantially non-collapsible under reflow conditions. The non-collapsible portion is attached to the interconnect site on the die. Typical materials for the non-collapsible portion include various solders having a high lead content. The collapsible portion is joined to the non-collapsible portion, and it is the collapsible portion that makes the connection with the lead. Typical materials for the collapsible portion of the composite bump include eutectic solder.

Figure 15:
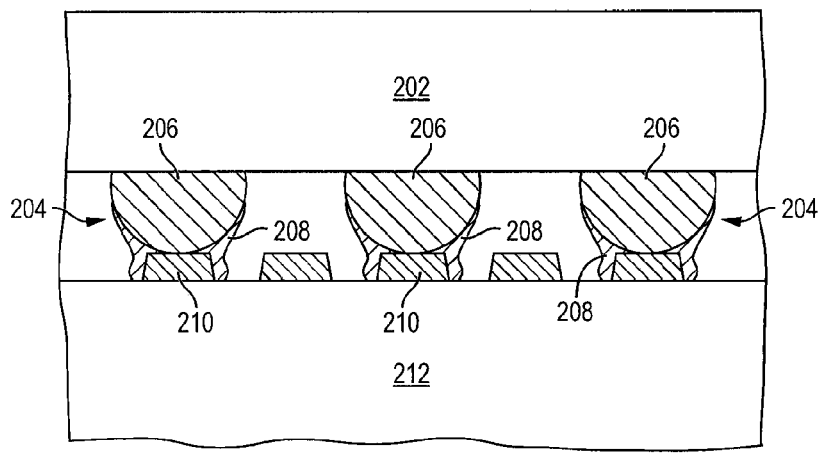
FIG. 15 illustrates a BOL flipchip interconnection having composite bumps.

FIG. 15 shows a BOL interconnect employing a composite bump. Semiconductor die 202 has die pads on the active side of the die with composite bumps 204 that include non-collapsible portion 206 and collapsible portion 208. The collapsible portion 208 can be a eutectic solder or a relatively low temperature melt solder. The collapsible portion 208 contacts the mating surface of lead 210 and, where deformation of the fusible portion of the bump over the lead is desired, the collapsible portion of the bump is deformable under the conditions of force employed. The non-collapsible portion 206 does not deform when semiconductor die 202 is moved under pressure against substrate 212 during processing, and does not melt during the reflow phase of the process. The non-collapsible portion 206 can be dimensioned to provide a standoff distance between the active surface of semiconductor die 202 and the die attach surface of substrate 212.

The bumps as shown in FIGS. 6, 7, 8, and 9 need not necessarily be fully collapsible bumps. The structures shown in those figures may alternatively be made using composite bumps, or using a solder-on-lead method, as described above.

FIGS. 16-21 describe other embodiments with various interconnect structures which can be used with the BOL interconnect structures, as described in FIGS. 6-15. FIG. 16a shows a semiconductor wafer 220 with a base substrate material 222, such as silicon, germanium, gallium arsenide, indium phosphide, or silicon carbide, for structural support. A plurality of semiconductor die or components 224 is formed on wafer 220 separated by saw streets 226 as described above.

Figure 16A:
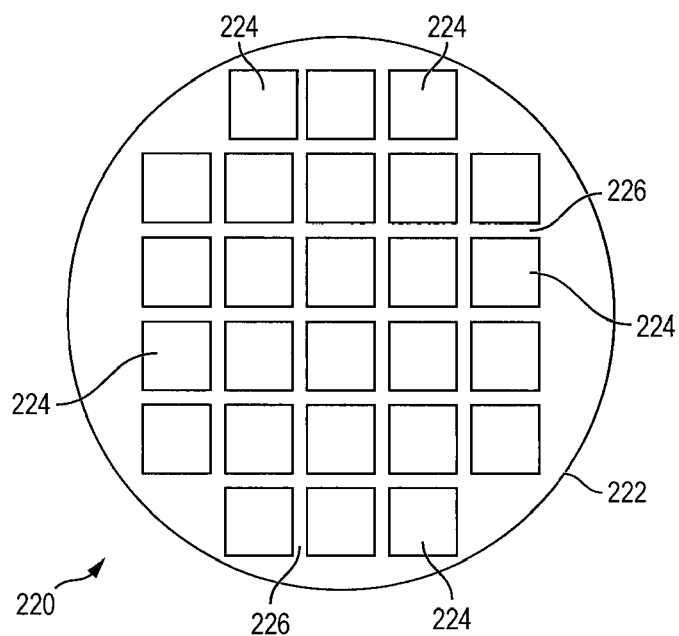
FIGS. 16a-16h illustrate various interconnect structures formed over a semiconductor die for bonding to conductive traces on a substrate.
Figure 16B:
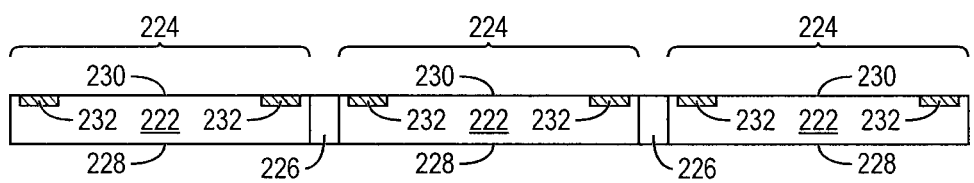

FIG. 16b shows a cross-sectional view of a portion of semiconductor wafer 220. Each semiconductor die 224 has a back surface 228 and active surface 230 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 230 to implement analog circuits or digital circuits, such as digital signal processor (DSP), ASIC, memory, or other signal processing circuit. Semiconductor die 224 may also contain integrated passive devices (IPDs), such as inductors, capacitors, and resistors, for RF signal processing. In one embodiment, semiconductor die 224 is a flipchip type semiconductor die.

An electrically conductive layer 232 is formed over active surface 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 operates as contact pads or bumps pads electrically connected to the circuits on active surface 230.

Figure 16C:
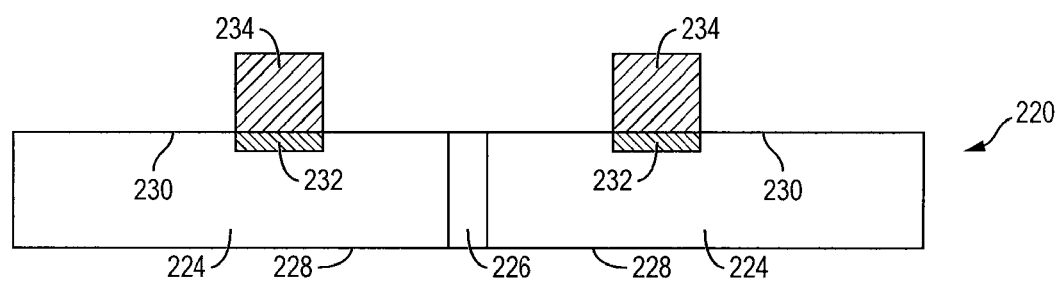
Figure 16D:
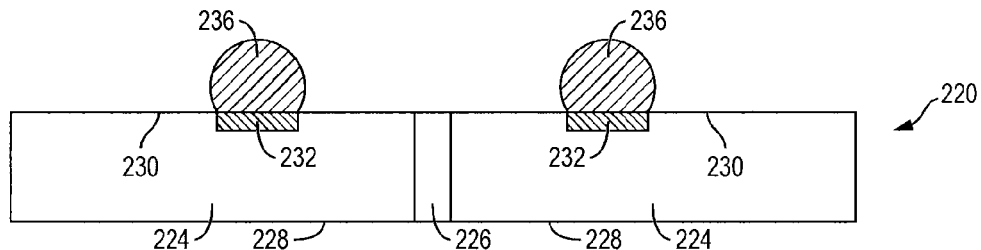

FIG. 16c shows a portion of semiconductor wafer 220 with an interconnect structure formed over contact pads 232. An electrically conductive bump material 234 is deposited over contact pads 232 using an evaporation, electrolytic plating, electroless plating, ball drop, or screen printing process. Bump material 234 can be Al, Sn, Ni, Au, Ag, Pb, Bi, Cu, solder, and combinations thereof, with an optional flux solution. For example, bump material 234 can be eutectic Sn/Pb, high-lead solder, or lead-free solder. Bump material 234 is generally compliant and undergoes plastic deformation greater than about 25 µm under a force equivalent to a vertical load of about 200 grams. Bump material 234 is bonded to contact pad 232 using a suitable attachment or bonding process. For example, bump material 234 can be compression bonded to contact pad 232. Bump material 234 can also be reflowed by heating the material above its melting point to form spherical balls or bumps 236, as shown in FIG. 16d. In some applications, bumps 236 are reflowed a second time to improve electrical connection to contact pad 232. Bumps 236 represent one type of interconnect structure that can be formed over contact pad 232. The interconnect structure can also use stud bump, micro bump, or other electrical interconnect.

Figure 16E:
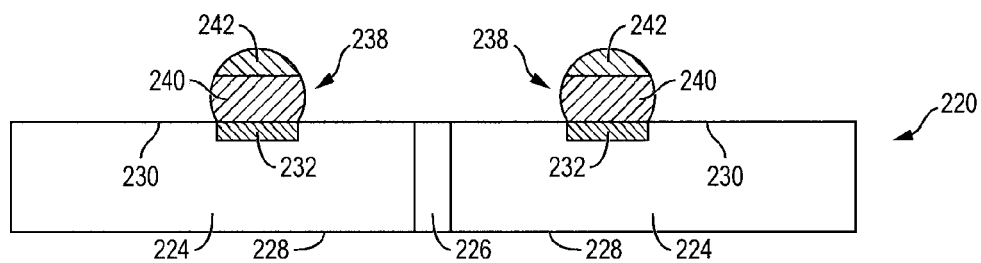

FIG. 16e shows another embodiment of the interconnect structure formed over contact pads 232 as composite bumps 238 including a non-fusible or non-collapsible portion 240 and fusible or collapsible portion 242. The fusible or collapsible and non-fusible or non-collapsible attributes are defined for bumps 238 with respect to reflow conditions. The non-fusible portion 240 can be Au, Cu, Ni, high-lead solder, or lead-tin alloy. The fusible portion 242 can be Sn, lead-free alloy, Sn—Ag alloy, Sn—Ag—Cu alloy, Sn—Ag-indium (In) alloy, eutectic solder, tin alloys with Ag, Cu, or Pb, or other relatively low temperature melt solder. In one embodiment, given a contact pad 232 width or diameter of 100 µm, the non-fusible portion 240 is about 45 µm in height and fusible portion 242 is about 35 µm in height.

Figure 16F:
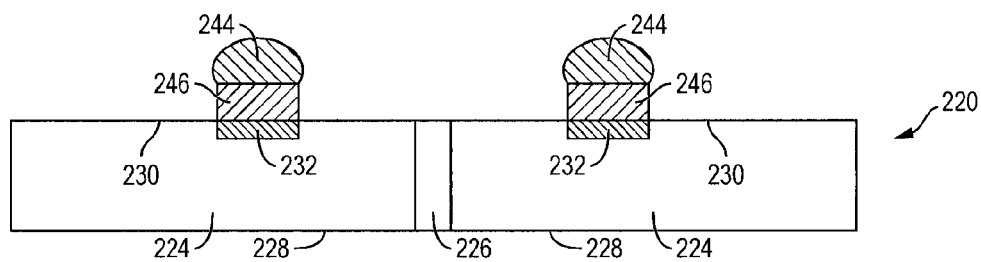

FIG. 16f shows another embodiment of the interconnect structure formed over contact pads 232 as bump 244 over conductive pillar 246. Bump 244 is fusible or collapsible and conductive pillar 246 is non-fusible or non-collapsible. The fusible or collapsible and non-fusible or non-collapsible attributes are defined with respect to reflow conditions. Bump 244 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. Conductive pillar 246 can be Au, Cu, Ni, high-lead solder, or lead-tin alloy. In one embodiment, conductive pillar 246 is a Cu pillar and bump 244 is a solder cap. Given a contact pad 232 width or diameter of 100 µm, conductive pillar 246 is about 45 µm in height and bump 244 is about 35 µm in height.

Figure 16G:
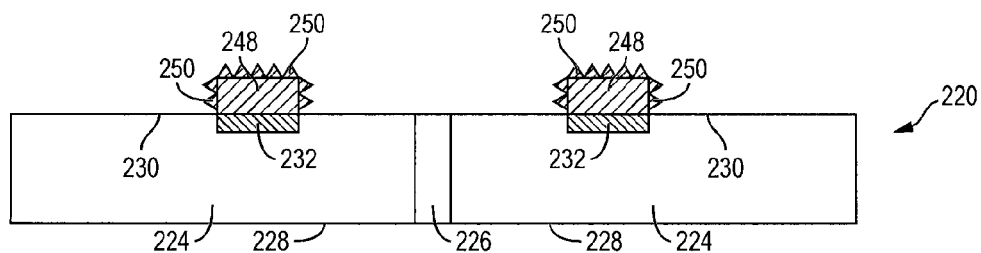

FIG. 16g shows another embodiment of the interconnect structure formed over contact pads 232 as bump material 248 with asperities 250. Bump material 248 is soft and deformable under reflow conditions with a low yield strength and high elongation to failure, similar to bump material 234. Asperities 250 are formed with a plated surface finish and are shown exaggerated in the figures for purposes of illustration. The scale of asperities 250 is generally in the order about 1-25 µm. The asperities can also be formed on bump 236, composite bump 238, and bump 244.

Figure 16H:
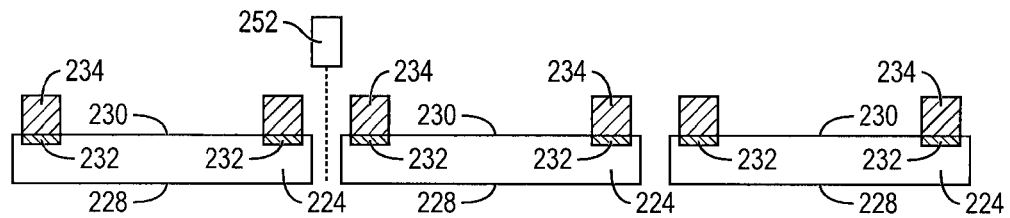

In FIG. 16h, semiconductor wafer 220 is singulated through saw street 226 using a saw blade or laser cutting tool 252 into individual semiconductor die 224.

Figure 17A:
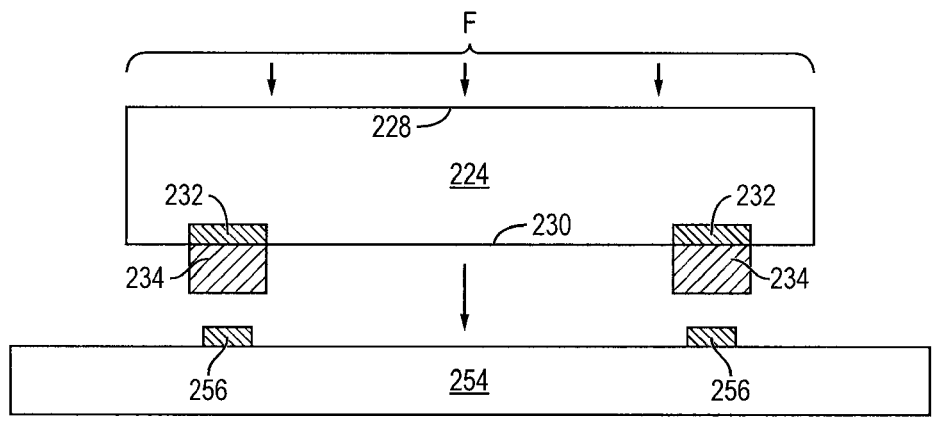
FIGS. 17a-17g illustrate the semiconductor die and interconnect structure bonded to the conductive traces.

FIG. 17a shows a substrate or PCB 254 with conductive trace 256. Substrate 254 can be a single-sided FR5 laminate or 2-sided BT-resin laminate. Semiconductor die 224 is positioned so that bump material 234 is aligned with an interconnect site on conductive trace 256, see FIGS. 25a-25g. Alternatively, bump material 234 can be aligned with a conductive pad or other interconnect site formed on substrate 254. Bump material 234 is wider than conductive trace 256. In one embodiment, bump material 234 has a width of less than 100 µm and conductive trace or pad 256 has a width of 35 µm for a bump pitch of 150 µm. Conductive traces 256 are similar to the escape traces and interconnect sites, as described in FIGS. 6-15, for increasing routing density.

Figure 17B:
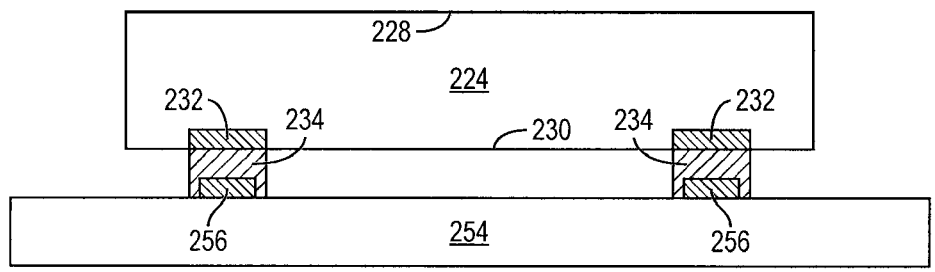

A pressure or force F is applied to back surface 228 of semiconductor die 224 to press bump material 234 onto conductive trace 256. The force F can be applied with an elevated temperature. Due to the compliant nature of bump material 234, the bump material deforms or extrudes around the top surface and side surface of conductive trace 256, referred to as BOL. In particular, the application of pressure causes bump material 234 to undergo a plastic deformation greater than about 25 µm under force F equivalent to a vertical load of about 200 grams and cover the top surface and side surface of the conductive trace, as shown in FIG. 17b. Bump material 234 can also be metallurgically connected to conductive trace 256 by bringing the bump material in physical contact with the conductive trace and then reflowing the bump material under a reflow temperature.

By making conductive trace 256 narrower than bump material 234, the conductive trace pitch can be reduced to increase routing density and I/O count. The narrower conductive trace 256 reduces the force F needed to deform bump material 234 around the conductive trace. For example, the requisite force F may be 30-50% of the force needed to deform bump material against a conductive trace or pad that is wider than the bump material. The lower compressive force F is useful for fine pitch interconnect and small die to maintain coplanarity with a specified tolerance and achieve uniform z-direction deformation and high reliability interconnect union. In addition, deforming bump material 234 around conductive trace 256 mechanically locks the bump to the trace to prevent die shifting or die floating during reflow.

Figure 17C:
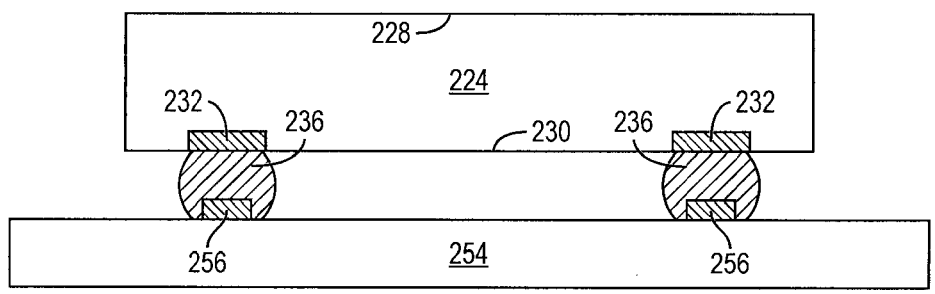

FIG. 17c shows bump 236 formed over contact pad 232 of semiconductor die 224. Semiconductor die 224 is positioned so that bump 236 is aligned with an interconnect site on conductive trace 256. Alternatively, bump 236 can be aligned with a conductive pad or other interconnect site formed on substrate 254. Bump 236 is wider than conductive trace 256. Conductive traces 256 are similar to the escape traces and interconnect sites, as described in FIGS. 6-15, for increasing routing density.

A pressure or force F is applied to back surface 228 of semiconductor die 224 to press bump 236 onto conductive trace 256. The force F can be applied with an elevated temperature. Due to the compliant nature of bump 236, the bump deforms or extrudes around the top surface and side surface of conductive trace 256. In particular, the application of pressure causes bump material 236 to undergo a plastic deformation and cover the top surface and side surface of conductive trace 256. Bump 236 can also be metallurgically connected to conductive trace 256 by bringing the bump in physical contact with the conductive trace under reflow temperature.

By making conductive trace 256 narrower than bump 236, the conductive trace pitch can be reduced to increase routing density and I/O count. The narrower conductive trace 256 reduces the force F needed to deform bump 236 around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming bump 236 around conductive trace 256 mechanically locks the bump to the trace to prevent die shifting or die floating during reflow.

Figure 17D:
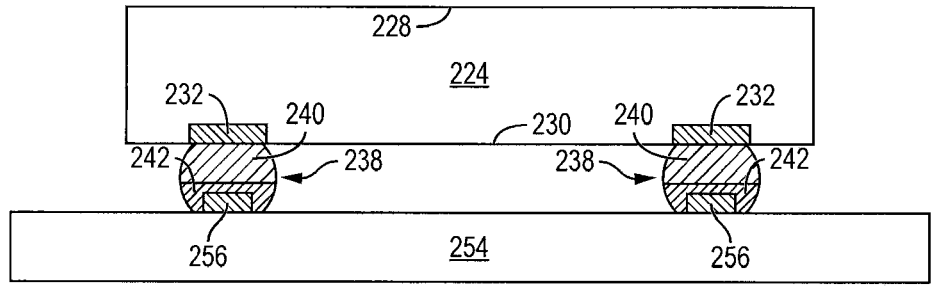

FIG. 17d shows composite bump 238 formed over contact pad 232 of semiconductor die 224. Semiconductor die 224 is positioned so that composite bump 238 is aligned with an interconnect site on conductive trace 256. Alternatively, composite bump 238 can be aligned with a conductive pad or other interconnect site formed on substrate 254. Composite bump 238 is wider than conductive trace 256. Conductive traces 256 are similar to the escape traces and interconnect sites, as described in FIGS. 6-15, for increasing routing density.

A pressure or force F is applied to back surface 228 of semiconductor die 224 to press fusible portion 242 onto conductive trace 256. The force F can be applied with an elevated temperature. Due to the compliant nature of fusible portion 242, the fusible portion deforms or extrudes around the top surface and side surfaces of conductive trace 256. In particular, the application of pressure causes fusible portion 242 to undergo a plastic deformation and cover the top surface and side surfaces of conductive trace 256. Composite bump 238 can also be metallurgically connected to conductive trace 256 by bringing fusible portion 242 in physical contact with the conductive trace under reflow temperature. The non-fusible portion 240 does not melt or deform during the application of pressure or temperature and retains its height and shape as a vertical standoff between semiconductor die 224 and substrate 254. The additional displacement between semiconductor die 224 and substrate 254 provides greater coplanarity tolerance between the mating surfaces.

During a reflow process, a large number (e.g., thousands) of composite bumps 238 on semiconductor die 224 are attached to interconnect sites on conductive trace 256 of substrate 254. Some of the bumps 238 may fail to properly connect to conductive trace 256, particularly if die 224 is warped. Recall that composite bump 238 can be wider than conductive trace 256. With a proper force applied, the fusible portion 242 deforms or extrudes around the top surface and side surfaces of conductive trace 256 and mechanically locks composite bump 238 to the conductive trace. The mechanical interlock is formed by nature of the fusible portion 242 being softer and more compliant than conductive trace 256 and therefore deforming over the top surface and around the side surfaces of the conductive trace for greater contact surface area. The mechanical interlock between composite bump 238 and conductive trace 256 holds the bump to the conductive trace during reflow, i.e., the bump and conductive trace do not lose contact. Accordingly, composite bump 238 mating to conductive trace 256 reduces bump interconnect failures.

Figure 17E:
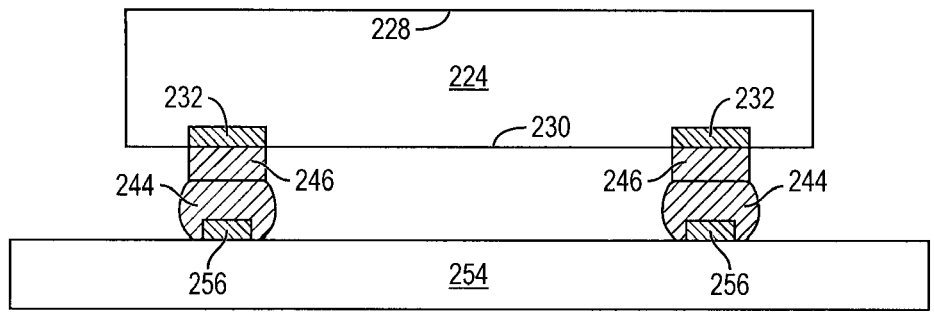

FIG. 17e shows conductive pillar 246 and bump 244 formed over contact pad 232 of semiconductor die 224. Semiconductor die 224 is positioned so that bump 244 is aligned with an interconnect site on conductive trace 256. Alternatively, bump 244 can be aligned with a conductive pad or other interconnect site formed on substrate 254. Bump 244 is wider than conductive trace 256. Conductive traces 256 are similar to the escape traces and interconnect sites, as described in FIGS. 6-15, for increasing routing density.

A pressure or force F is applied to back surface 228 of semiconductor die 224 to press bump 244 onto conductive trace 256. The force F can be applied with an elevated temperature. Due to the compliant nature of bump 244, the bump deforms or extrudes around the top surface and side surfaces of conductive trace 256. In particular, the application of pressure causes bump 244 to undergo a plastic deformation and cover the top surface and side surfaces of conductive trace 256. Conductive pillar 246 and bump 244 can also be metallurgically connected to conductive trace 256 by bringing the bump in physical contact with the conductive trace under reflow temperature. Conductive pillar 246 does not melt or deform during the application of pressure or temperature and retains its height and shape as a vertical standoff between semiconductor die 224 and substrate 254. The additional displacement between semiconductor die 224 and substrate 254 provides greater coplanarity tolerance between the mating surfaces. The wider bump 244 and narrower conductive trace 256 have similar low requisite compressive force and mechanical locking features and advantages described above for bump material 234 and bump 236.

Figure 17F:
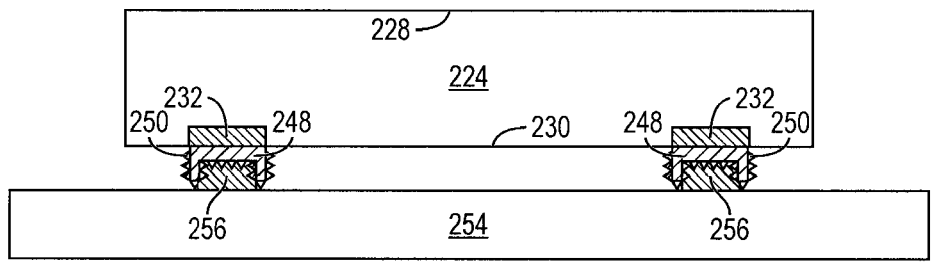

FIG. 17f shows bump material 248 with asperities 250 formed over contact pad 232 of semiconductor die 224. Semiconductor die 224 is positioned so that bump material 248 is aligned with an interconnect site on conductive trace 256. Alternatively, bump material 248 can be aligned with a conductive pad or other interconnect site formed on substrate 254. Bump material 248 is wider than conductive trace 256. A pressure or force F is applied to back surface 228 of semiconductor die 224 to press bump material 248 onto conductive trace 256. The force F can be applied with an elevated temperature. Due to the compliant nature of bump material 248, the bump deforms or extrudes around the top surface and side surfaces of conductive trace 256. In particular, the application of pressure causes bump material 248 to undergo a plastic deformation and cover the top surface and side surfaces of conductive trace 256. In addition, asperities 250 are metallurgically connected to conductive trace 256. Asperities 250 are sized on the order about 1-25 μm.

Figure 17G:
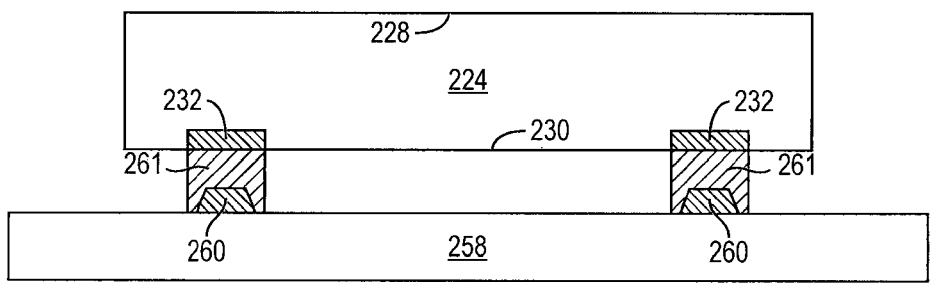

FIG. 17g shows a substrate or PCB 258 with trapezoidal conductive trace 260 having angled or sloped sides. Bump material 261 is formed over contact pad 232 of semiconductor die 224. Semiconductor die 224 is positioned so that bump material 261 is aligned with an interconnect site on conductive trace 260. Alternatively, bump material 261 can be aligned with a conductive pad or other interconnect site formed on substrate 258. Bump material 261 is wider than conductive trace 260. Conductive traces 260 are similar to the escape traces and interconnect sites, as described in FIGS. 6-15, for increasing routing density.

A pressure or force F is applied to back surface 228 of semiconductor die 224 to press bump material 261 onto conductive trace 260. The force F can be applied with an elevated temperature. Due to the compliant nature of bump material 261, the bump material deforms or extrudes around the top surface and side surfaces of conductive trace 260. In particular, the application of pressure causes bump material 261 to undergo a plastic deformation under force F to cover the top surface and the angled side surfaces of conductive trace 260. Bump material 261 can also be metallurgically connected to conductive trace 260 by bringing the bump material in physical contact with the conductive trace and then reflowing the bump material under a reflow temperature.

FIGS. 18a-18d show a BOL embodiment of semiconductor die 224 and elongated composite bump 262 having a non-fusible or non-collapsible portion 264 and fusible or collapsible portion 266. The non-fusible portion 264 can be Au, Cu, Ni, high-lead solder, or lead-tin alloy. The fusible portion 266 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. The non-fusible portion 264 makes up a larger part of composite bump 262 than the fusible portion 266. The non-fusible portion 264 is fixed to contact pad 232 of semiconductor die 224.

Figure 18A:
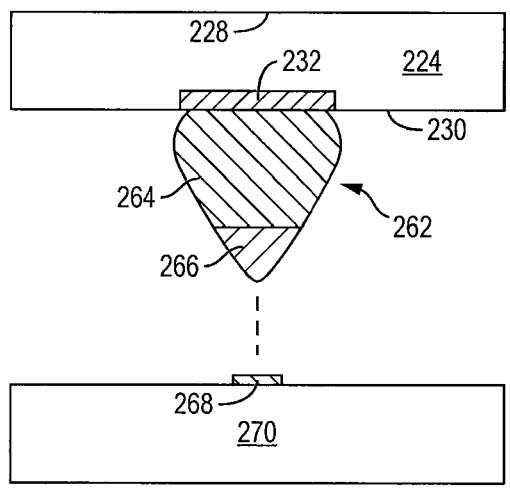
FIGS. 18a-18d illustrate the semiconductor die with a wedge-shaped interconnect structure bonded to the conductive traces.
Figure 18B:
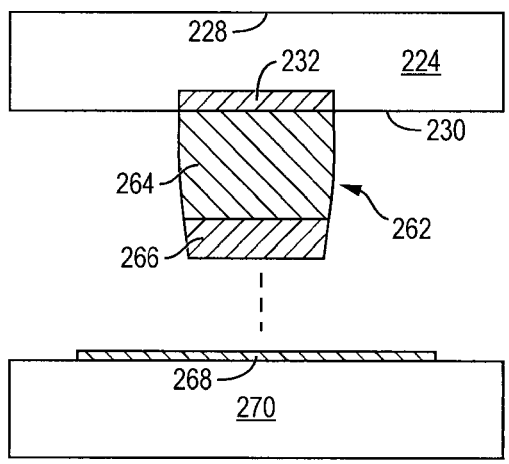
Figure 18C:
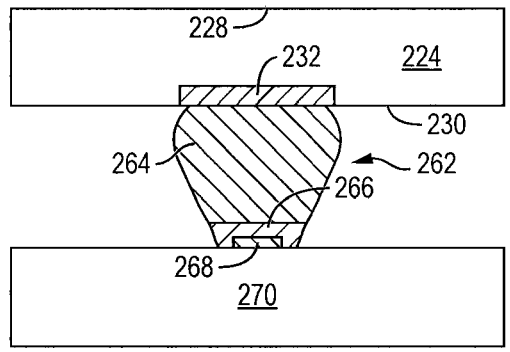
Figure 18D:
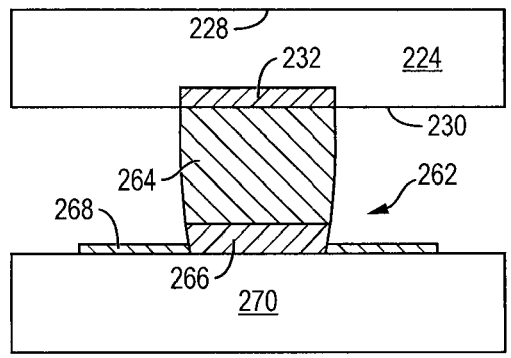

Semiconductor die 224 is positioned so that composite bump 262 is aligned with an interconnect site on conductive trace 268 formed on substrate 270, as shown in FIG. 18a. Composite bump 262 is tapered along conductive trace 268, i.e., the composite bump has a wedge shape, longer along a length of conductive trace 268 and narrower across the conductive trace. The tapered aspect of composite bump 262 occurs along the length of conductive trace 268. The view in FIG. 18a shows the shorter aspect or narrowing taper co-linear with conductive trace 268. The view in FIG. 18b, normal to FIG. 18a, shows the longer aspect of the wedge-shaped composite bump 262. The shorter aspect of composite bump 262 is wider than conductive trace 268. The fusible portion 266 collapses around conductive trace 268 upon application of pressure and/or reflow with heat, as shown in FIGS. 18c and 18d. The non-fusible portion 264 does not melt or deform during reflow and retains its form and shape. The non-fusible portion 264 can be dimensioned to provide a standoff distance between semiconductor die 224 and substrate 270. A finish such as Cu OSP can be applied to substrate 270. Conductive traces 268 are similar to the escape traces and interconnect sites, as described in FIGS. 6-15, for increasing routing density.

During a reflow process, a large number (e.g., thousands) of composite bumps 262 on semiconductor die 224 are attached to interconnect sites on conductive trace 268 of substrate 270. Some of the bumps 262 may fail to properly connect to conductive trace 268, particularly if semiconductor die 224 is warped. Recall that composite bump 262 can be wider than conductive trace 268. With a proper force applied, the fusible portion 266 deforms or extrudes around the top surface and side surfaces of conductive trace 268 and mechanically locks composite bump 262 to the conductive trace. The mechanical interlock is formed by nature of the fusible portion 266 being softer and more compliant than conductive trace 268 and therefore deforming around the top surface and side surfaces of the conductive trace for greater contact area. The wedge-shape of composite bump 262 increases contact area between the bump and conductive trace, e.g., along the longer aspect of FIGS. 18b and 18d, without sacrificing pitch along the shorter aspect of FIGS. 18a and 18c. The mechanical interlock between composite bump 262 and conductive trace 268 holds the bump to the conductive trace during reflow, i.e., the bump and conductive trace do not lose contact. Accordingly, composite bump 262 mating to conductive trace 268 reduces bump interconnect failures.

Figure 19A:
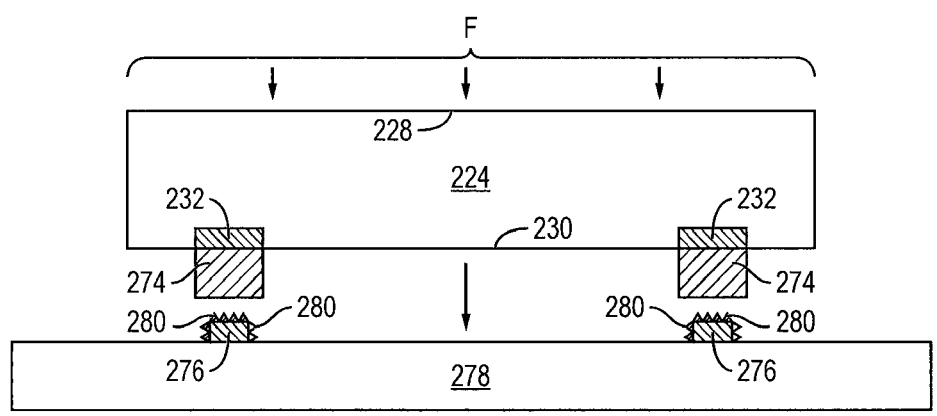
FIGS. 19a-19d illustrate another embodiment of the semiconductor die and interconnect structure bonded to the conductive traces.

FIGS. 19a-19d show a BOL embodiment of semiconductor die 224 with bump material 274 formed over contact pads 232, similar to FIG. 16c. In FIG. 19a, bump material 274 is generally compliant and undergoes plastic deformation greater than about 25 µm under a force equivalent to a vertical load of about 200 grams. Bump material 274 is wider than conductive trace 276 on substrate 278. A plurality of asperities 280 is formed on conductive trace 276 with a height on the order about 1-25 µm.

Figure 19B:
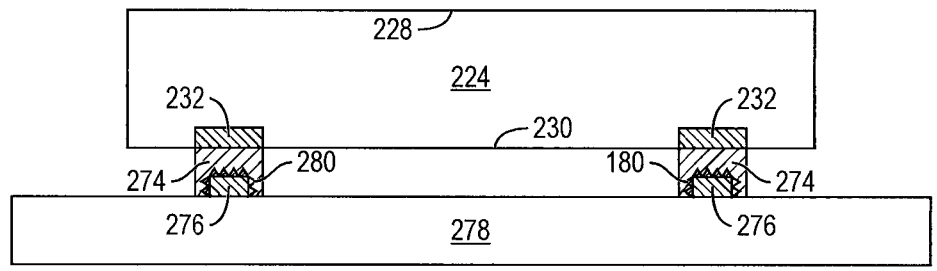

Semiconductor die 224 is positioned so that bump material 274 is aligned with an interconnect site on conductive trace 276. Alternatively, bump material 274 can be aligned with a conductive pad or other interconnect site formed on substrate 278. A pressure or force F is applied to back surface 228 of semiconductor die 224 to press bump material 274 onto conductive trace 276 and asperities 280, as shown in FIG. 19b. The force F can be applied with an elevated temperature. Due to the compliant nature of bump material 274, the bump material deforms or extrudes around the top surface and side surfaces of conductive trace 276 and asperities 280. In particular, the application of pressure causes bump material 274 to undergo a plastic deformation and cover the top surface and side surfaces of conductive trace 276 and asperities 280. The plastic flow of bump material 274 creates macroscopic mechanical interlocking points between the bump material and the top surface and side surfaces of conductive trace 276 and asperities 280. The plastic flow of bump material 274 occurs around the top surface and side surfaces of conductive trace 276 and asperities 280, but does not extend excessively onto substrate 278, which could cause electrical shorting and other defects. The mechanical interlock between the bump material and the top surface and side surfaces of conductive trace 276 and asperities 280 provides a robust connection with greater contact area between the respective surfaces, without significantly increasing the bonding force. The mechanical interlock between the bump material and the top surface and side surfaces of conductive trace 276 and asperities 280 also reduces lateral die shifting during subsequent manufacturing processes, such as encapsulation.

Figure 19C:
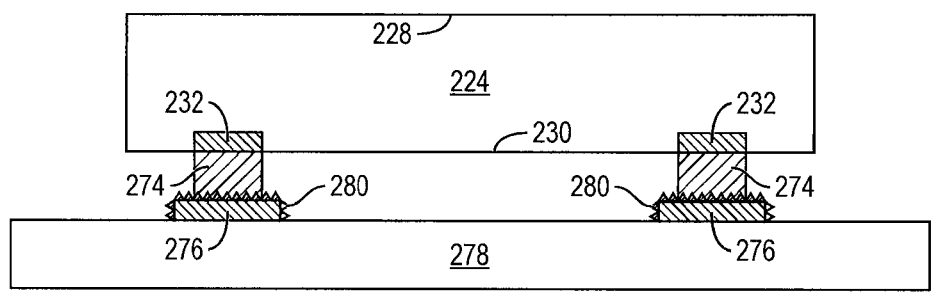

FIG. 19c shows another BOL embodiment with bump material 274 narrower than conductive trace 276. A pressure or force F is applied to back surface 228 of semiconductor die 224 to press bump material 274 onto conductive trace 276 and asperities 280. The force F can be applied with an elevated temperature. Due to the compliant nature of bump material 274, the bump material deforms or extrudes over the top surface of conductive trace 276 and asperities 280. In particular, the application of pressure causes bump material 274 to undergo a plastic deformation and cover the top surface of conductive trace 276 and asperities 280. The plastic flow of bump material 274 creates macroscopic mechanical interlocking points between the bump material and the top surface of conductive trace 276 and asperities 280. The mechanical interlock between the bump material and the top surface of conductive trace 276 and asperities 280 provides a robust connection with greater contact area between the respective surfaces, without significantly increasing the bonding force. The mechanical interlock between the bump material and the top surface of conductive trace 276 and asperities 280 also reduces lateral die shifting during subsequent manufacturing processes, such as encapsulation.

Figure 19D:
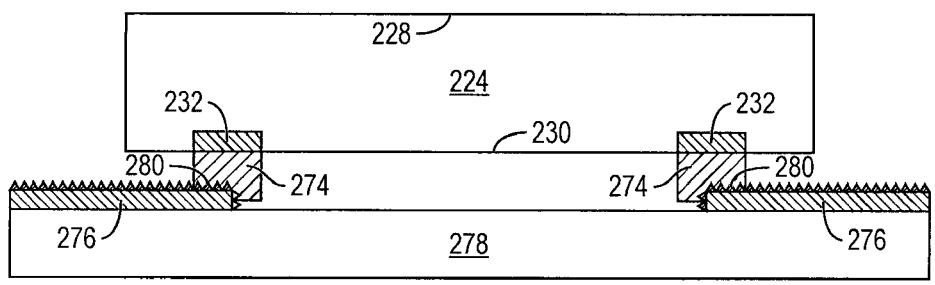

FIG. 19d shows another BOL embodiment with bump material 274 formed over an edge of conductive trace 276, i.e., part of the bump material is over the conductive trace and part of the bump material is not over the conductive trace. A pressure or force F is applied to back surface 228 of semiconductor die 224 to press bump material 274 onto conductive trace 276 and asperities 280. The force F can be applied with an elevated temperature. Due to the compliant nature of bump material 274, the bump material deforms or extrudes over the top surface and side surfaces of conductive trace 276 and asperities 280. In particular, the application of pressure causes bump material 274 to undergo a plastic deformation and cover the top surface and side surfaces of conductive trace 276 and asperities 280. The plastic flow of bump material 274 creates macroscopic mechanical interlocking between the bump material and the top surface and side surfaces of conductive trace 276 and asperities 280. The mechanical interlock between the bump material and the top surface and side surfaces of conductive trace 276 and asperities 280 provides a robust connection with greater contact area between the respective surfaces, without significantly increasing the bonding force. The mechanical interlock between the bump material and the top surface and side surfaces of conductive trace 276 and asperities 280 also reduces lateral die shifting during subsequent manufacturing processes, such as encapsulation.

Figure 20A:
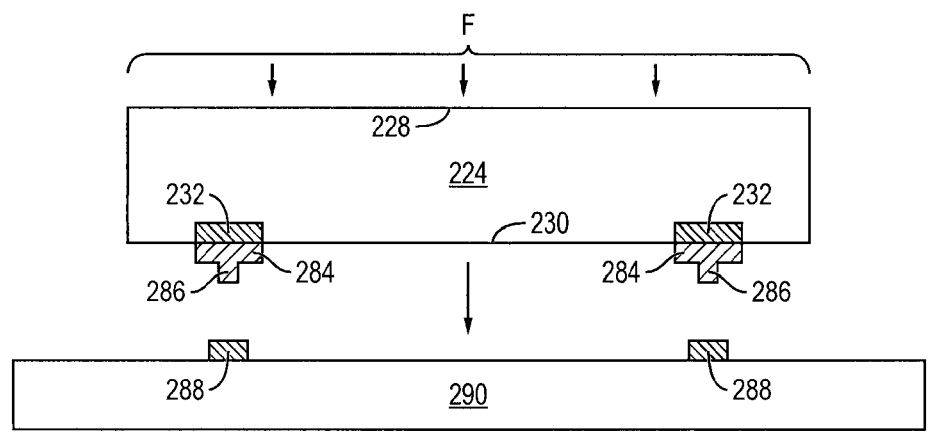
FIGS. 20a-20c illustrate stepped bump and stud bump interconnect structures bonded to the conductive traces.
Figure 20B:
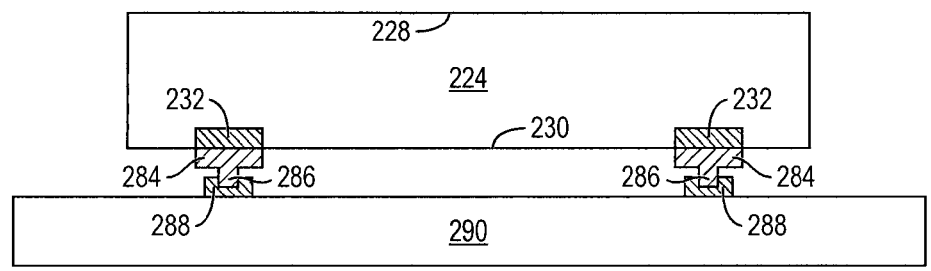
Figure 20C:
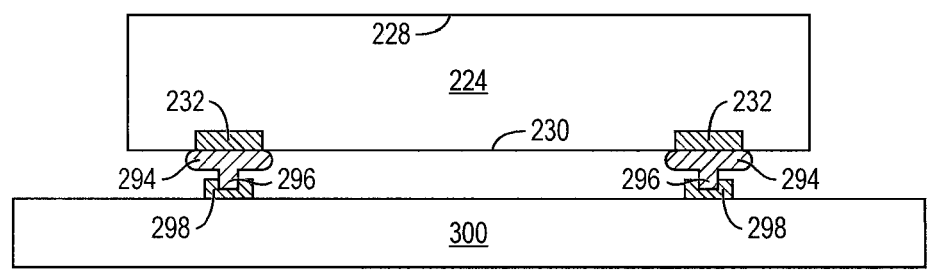

FIGS. 20a-20c show a BOL embodiment of semiconductor die 224 with bump material 284 formed over contact pads 232, similar to FIG. 16c. A tip 286 extends from the body of bump material 284 as a stepped bump with tip 286 narrower than the body of bump material 284, as shown in FIG. 20a. Semiconductor die 224 is positioned so that bump material 284 is aligned with an interconnect site on conductive trace 288 on substrate 290. More specifically, tip 286 is centered over an interconnect site on conductive trace 288. Alternatively, bump material 284 and tip 286 can be aligned with a conductive pad or other interconnect site formed on substrate 290. Bump material 284 is wider than conductive trace 288 on substrate 290.

Conductive trace 288 is generally compliant and undergoes plastic deformation greater than about 25 µm under a force equivalent to a vertical load of about 200 grams. A pressure or force F is applied to back surface 228 of semiconductor die 224 to press tip 284 onto conductive trace 288. The force F can be applied with an elevated temperature. Due to the compliant nature of conductive trace 288, the conductive trace deforms around tip 286, as shown in FIG. 20b. In particular, the application of pressure causes conductive trace 288 to undergo a plastic deformation and cover the top surface and side surfaces of tip 286.

FIG. 20c shows another BOL embodiment with rounded bump material 294 formed over contact pads 232. A tip 296 extends from the body of bump material 294 to form a stud bump with the tip narrower than the body of bump material 294. Semiconductor die 224 is positioned so that bump material 294 is aligned with an interconnect site on conductive trace 298 on substrate 300. More specifically, tip 296 is centered over an interconnect site on conductive trace 298. Alternatively, bump material 294 and tip 296 can be aligned with a conductive pad or other interconnect site formed on substrate 300. Bump material 294 is wider than conductive trace 298 on substrate 300.

Conductive trace 298 is generally compliant and undergoes plastic deformation greater than about 25 µm under a force equivalent to a vertical load of about 200 grams. A pressure or force F is applied to back surface 228 of semiconductor die 224 to press tip 296 onto conductive trace 298. The force F can be applied with an elevated temperature. Due to the compliant nature of conductive trace 298, the conductive trace deforms around tip 296. In particular, the application of pressure causes conductive trace 298 to undergo a plastic deformation and cover the top surface and side surfaces of tip 296.

The conductive traces described in FIGS. 17a-17g, 18a-18d, and 19a-19d can also be compliant material as described in FIGS. 20a-20c.

Figure 21A:
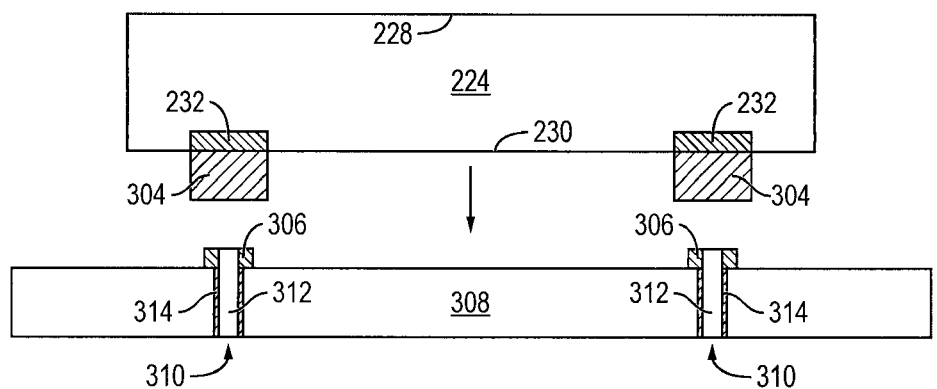
FIGS. 21a-21b illustrate conductive traces with conductive vias.
Figure 21B:
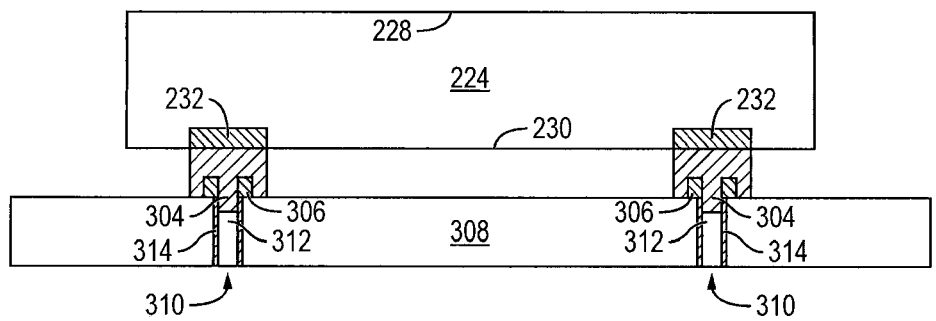

FIGS. 21a-21b show a BOL embodiment of semiconductor die 224 with bump material 304 formed over contact pads 232, similar to FIG. 16c. Bump material 304 is generally compliant and undergoes plastic deformation greater than about 25 µm under a force equivalent to a vertical load of about 200 grams. Bump material 304 is wider than conductive trace 306 on substrate 308. A conductive via 310 is formed through conductive trace 306 with an opening 312 and conductive sidewalls 314, as shown in FIG. 21a. Conductive traces 306 are similar to the escape traces and interconnect sites, as described in FIGS. 6-15, for increasing routing density.

Semiconductor die 224 is positioned so that bump material 304 is aligned with an interconnect site on conductive trace 306, see FIGS. 25a-25g. Alternatively, bump material 304 can be aligned with a conductive pad or other interconnect site formed on substrate 308. A pressure or force F is applied to back surface 228 of semiconductor die 224 to press bump material 304 onto conductive trace 306 and into opening 312 of conductive via 310. The force F can be applied with an elevated temperature. Due to the compliant nature of bump material 304, the bump material deforms or extrudes around the top surface and side surfaces of conductive trace 306 and into opening 312 of conductive vias 310, as shown in FIG. 21b. In particular, the application of pressure causes bump material 304 to undergo a plastic deformation and cover the top surface and side surfaces of conductive trace 306 and into opening 312 of conductive via 310. Bump material 304 is thus electrically connected to conductive trace 306 and conductive sidewalls 314 for z-direction vertical interconnect through substrate 308. The plastic flow of bump material 304 creates a mechanical interlock between the bump material and the top surface and side surfaces of conductive trace 306 and opening 312 of conductive via 310. The mechanical interlock between the bump material and the top surface and side surfaces of conductive trace 306 and opening 312 of conductive via 310 provides a robust connection with greater contact area between the respective surfaces, without significantly increasing the bonding force. The mechanical interlock between the bump material and the top surface and side surfaces of conductive trace 306 and opening 312 of conductive via 310 also reduces lateral die shifting during subsequent manufacturing processes, such as encapsulation. Since conductive via 310 is formed within the interconnect site with bump material 304, the total substrate interconnect area is reduced.

In the BOL embodiments of FIGS. 17a-17g, 18a-18d, 19a-19d, 20a-20c, and 21a-21b, by making the conductive trace narrower than the interconnect structure, the conductive trace pitch can be reduced to increase routing density and I/O count. The narrower conductive trace reduces the force F needed to deform the interconnect structure around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming the interconnect structure around the conductive trace mechanically locks the bump to the trace to prevent die shifting or die floating during reflow.

Figure 22C:
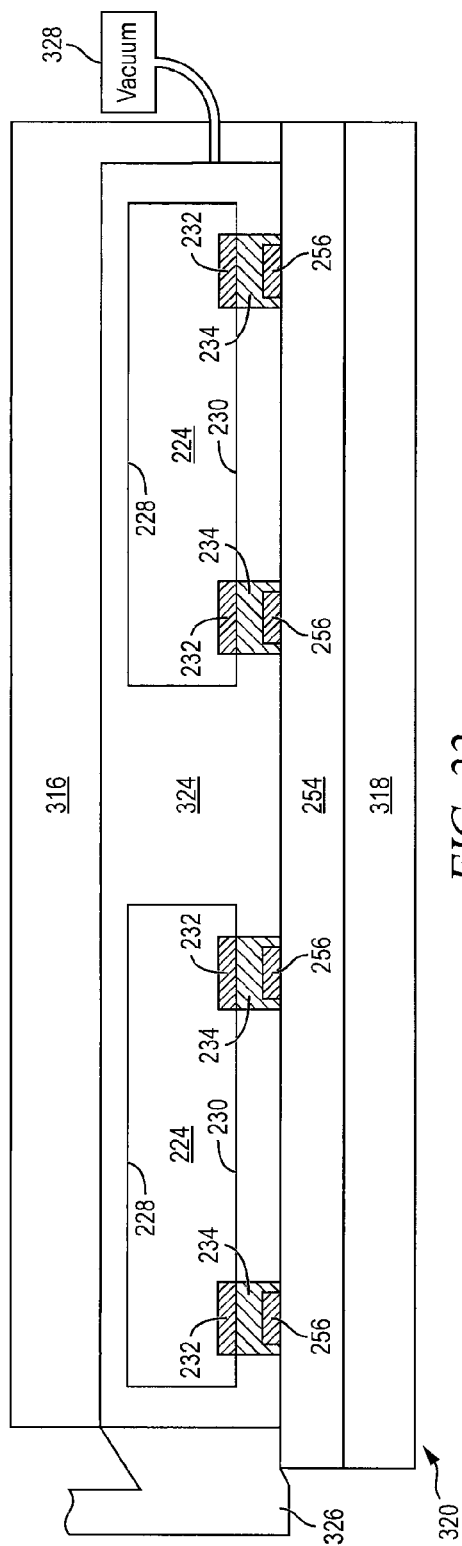

FIGS. 22a-22c show a mold underfill (MUF) process to deposit encapsulant around the bumps between the semiconductor die and substrate. FIG. 22a shows semiconductor die 224 mounted to substrate 254 using bump material 234 from FIG. 17b and placed between upper mold support 316 and lower mold support 318 of chase mold 320. The other semiconductor die and substrate combinations from FIGS. 17a-17g, 18a-18d, 19a-19d, 20a-20c, and 21a-21b can be placed between upper mold support 316 and lower mold support 318 of chase mold 320. The upper mold support 316 includes compressible releasing film 322.

In FIG. 22b, upper mold support 316 and lower mold support 318 are brought together to enclose semiconductor die 224 and substrate 254 with an open space over the substrate and between the semiconductor die and substrate. Compressible releasing film 322 conforms to back surface 228 and side surfaces of semiconductor die 224 to block formation of encapsulant on these surfaces. An encapsulant 324 in a liquid state is injected into one side of chase mold 320 with nozzle 326 while an optional vacuum assist 328 draws pressure from the opposite side to uniformly fill the open space over substrate 254 and the open space between semiconductor die 224 and substrate 254 with the encapsulant. Encapsulant 324 can be polymer composite material, such as epoxy resin with filler, epoxy acrylate with filler, or polymer with proper filler. Encapsulant 324 is non-conductive and environmentally protects the semiconductor device from external elements and contaminants. Compressible material 322 prevents encapsulant 324 from flowing over back surface 228 and around the side surfaces of semiconductor die 224. Encapsulant 324 is cured. The back surface 228 and side surfaces of semiconductor die 224 remain exposed from encapsulant 324.

FIG. 22c shows an embodiment of MUF and mold overfill (MOF), i.e., without compressible material 322. Semiconductor die 224 and substrate 254 are placed between upper mold support 316 and lower mold support 318 of chase mold 320. The upper mold support 316 and lower mold support 318 are brought together to enclose semiconductor die 224 and substrate 254 with an open space over the substrate, around the semiconductor die, and between the semiconductor die and substrate. Encapsulant 324 in a liquid state is injected into one side of chase mold 320 with nozzle 326 while an optional vacuum assist 328 draws pressure from the opposite side to uniformly fill the open space around semiconductor die 224 and over substrate 254 and the open space between semiconductor die 224 and substrate 254 with the encapsulant. Encapsulant 324 is cured.

Figure 23:
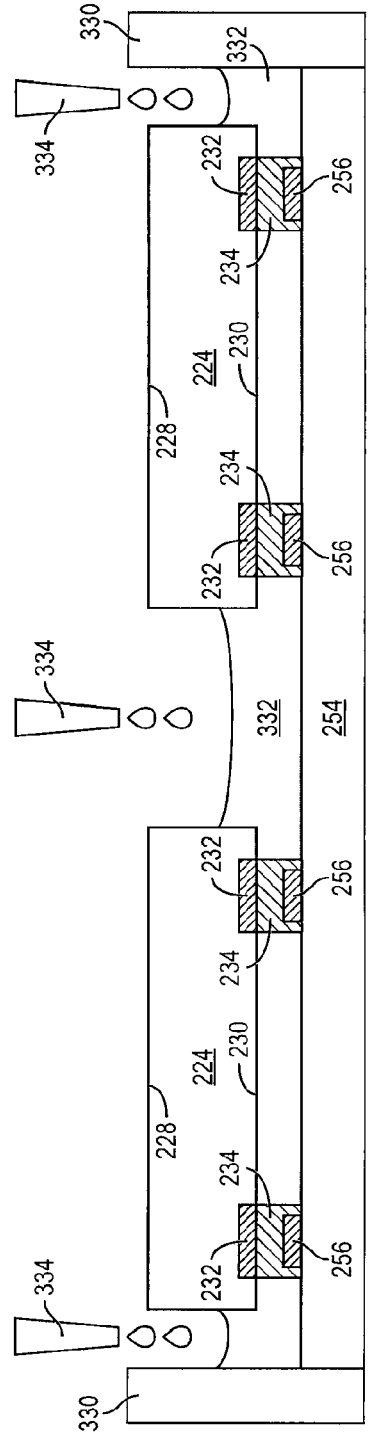
FIG. 23 illustrates another mold underfill between the semiconductor die and substrate.

FIG. 23 shows another embodiment of depositing encapsulant around semiconductor die 224 and in the gap between semiconductor die 224 and substrate 254. Semiconductor die 224 and substrate 254 are enclosed by dam 330. Encapsulant 332 is dispensed from nozzles 334 in a liquid state into dam 330 to fill the open space over substrate 254 and the open space between semiconductor die 224 and substrate 254. The volume of encapsulant 332 dispensed from nozzles 334 is controlled to fill dam 330 without covering back surface 228 or the side surfaces of semiconductor die 224. Encapsulant 332 is cured.

Figure 24:
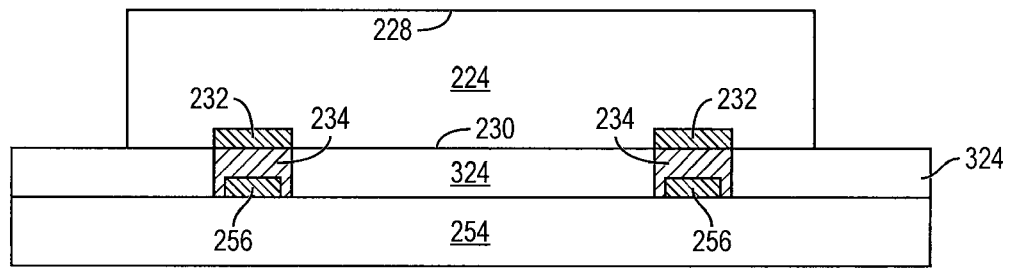
FIG. 24 illustrates the semiconductor die and substrate after mold underfill.

FIG. 24 shows semiconductor die 224 and substrate 254 after the MUF process from FIGS. 22a, 22c, and 23. Encapsulant 324 is uniformly distributed over substrate 254 and around bump material 234 between semiconductor die 224 and substrate 254.

Figure 25A:
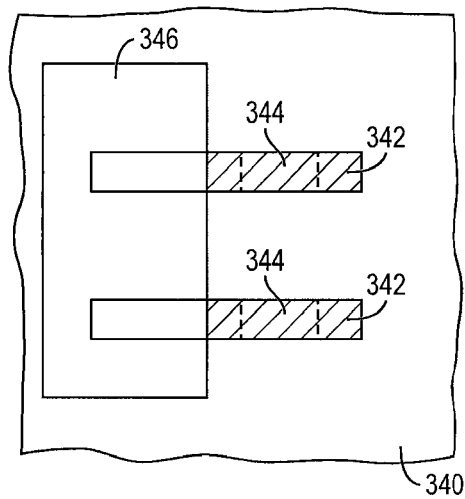
FIGS. 25a-25g illustrate various arrangements of the conductive traces with open solder registration.

FIGS. 25a-25g show top views of various conductive trace layouts on substrate or PCB 340. In FIG. 25a, conductive trace 342 is a straight conductor with integrated bump pad or interconnect site 344 formed on substrate 340. The sides of substrate bump pad 344 can be co-linear with conductive trace 342. In the prior art, a solder registration opening (SRO) is typically formed over the interconnect site to contain the bump material during reflow. The SRO increases interconnect pitch and reduces I/O count. In contrast, masking layer 346 can be formed over a portion of substrate 340; however, the masking layer is not formed around substrate bump pad 344 of conductive trace 342. That is, the portion of conductive trace 342 designed to mate with the bump material is devoid of any SRO of masking layer 346 that would have been used for bump containment during reflow.

Semiconductor die 224 is placed over substrate 340 and the bump material is aligned with substrate bump pads 344. The bump material is electrically and metallurgically connected to substrate bump pads 344 by bringing the bump material in physical contact with the bump pad and then reflowing the bump material under a reflow temperature.

Figure 25B:
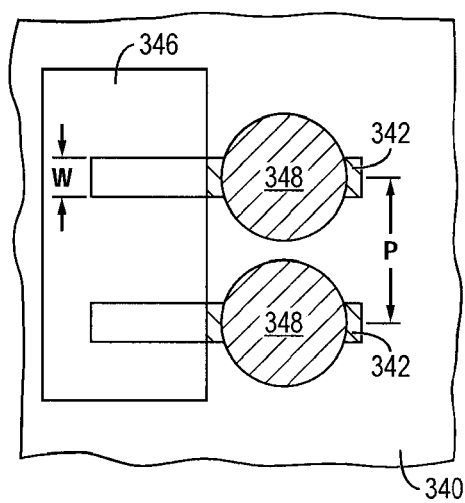

In another embodiment, an electrically conductive bump material is deposited over substrate bump pad 344 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 344 using a suitable attachment or bonding process. In one embodiment, the bump material is reflowed by heating the material above its melting point to form bump or interconnect 348, as shown in FIG. 25b. In some applications, bump 348 is reflowed a second time to improve electrical contact to substrate bump pad 344. The bump material around the narrow substrate bump pad 344 maintains die placement during reflow.

In high routing density applications, it is desirable to minimize escape pitch of conductive traces 342. The escape pitch between conductive traces 342 can be reduced by eliminating the masking layer for the purpose of reflow containment, i.e., by reflowing the bump material without a masking layer. Since no SRO is formed around die bump pad 232 or substrate bump pad 344, conductive traces 342 can be formed with a finer pitch, i.e., conductive trace 342 can be disposed closer together or to nearby structures. With no SRO around substrate bump pad 344, the pitch between conductive traces 342 is given as P=D+PLT+W/2, wherein D is the base diameter of bump 348, PLT is die placement tolerance, and W is the width of conductive trace 342. In one embodiment, given a bump base diameter of 100 µm, PLT of 10 µm, and trace line width of 30 µm, the minimum escape pitch of conductive trace 342 is 125 µm. The mask-less bump formation eliminates the need to account for the ligament spacing of masking material between adjacent openings, solder mask registration tolerance (SRT), and minimum resolvable SRO, as found in the prior art.

When the bump material is reflowed without a masking layer to metallurgically and electrically connect die bump pad 232 to substrate bump pad 344, the wetting and surface tension causes the bump material to maintain self-confinement and be retained within the space between die bump pad 232 and substrate bump pad 344 and portion of substrate 340 immediately adjacent to conductive trace 342 substantially within the footprint of the bump pads.

To achieve the desired self-confinement property, the bump material can be immersed in a flux solution prior to placement on die bump pad 232 or substrate bump pad 344 to selectively render the region contacted by the bump material more wettable than the surrounding area of conductive traces 342. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 340 is not needed around die bump pad 232 or substrate bump pad 344.

Figure 25C:
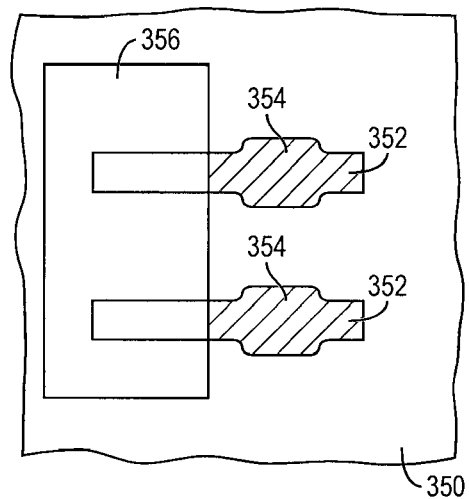

FIG. 25c shows another embodiment of parallel conductive traces 352 as a straight conductor with integrated rectangular bump pad or interconnect site 354 formed on substrate 350. In this case, substrate bump pad 354 is wider than conductive trace 352, but less than the width of the mating bump. The sides of substrate bump pad 354 can be parallel to conductive trace 352. Masking layer 356 can be formed over a portion of substrate 350; however, the masking layer is not formed around substrate bump pad 354 of conductive trace 352. That is, the portion of conductive trace 352 designed to mate with the bump material is devoid of any SRO of masking layer 356 that would have been used for bump containment during reflow.

Figure 25D:
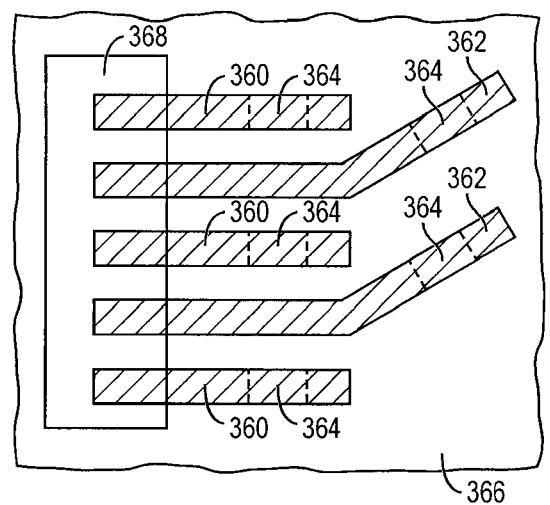

FIG. 25d shows another embodiment of conductive traces 360 and 362 arranged in an array of multiple rows with offset integrated bump pad or interconnect site 364 formed on substrate 366 for maximum interconnect escape routing density and capacity. Alternate conductive traces 360 and 362 include an elbow for routing to bump pads 364. The sides of each substrate bump pad 364 is co-linear with conductive traces 360 and 362. Masking layer 368 can be formed over a portion of substrate 366; however, masking layer 368 is not formed around substrate bump pad 364 of conductive traces 360 and 362. That is, the portion of conductive trace 360 and 362 designed to mate with the bump material is devoid of any SRO of masking layer 368 that would have been used for bump containment during reflow.

Figure 25E:
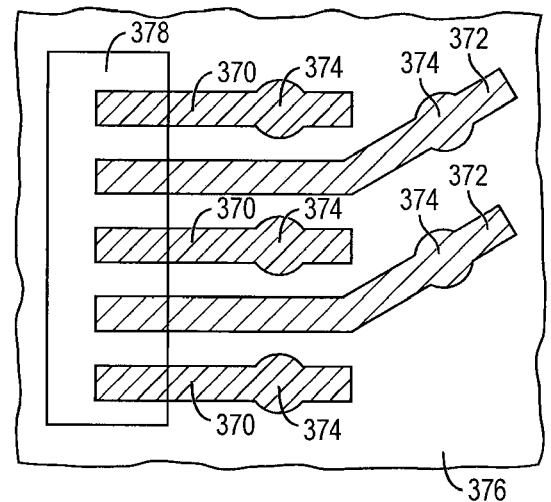

FIG. 25e shows another embodiment of conductive traces 370 and 372 arranged in an array of multiple rows with offset integrated bump pad or interconnect site 374 formed on substrate 376 for maximum interconnect escape routing density and capacity. Alternate conductive traces 370 and 372 include an elbow for routing to bump pads 374. In this case, substrate bump pad 374 is rounded and wider than conductive traces 370 and 372, but less than the width of the mating interconnect bump material. Masking layer 378 can be formed over a portion of substrate 376; however, masking layer 378 is not formed around substrate bump pad 374 of conductive traces 370 and 372. That is, the portion of conductive trace 370 and 372 designed to mate with the bump material is devoid of any SRO of masking layer 378 that would have been used for bump containment during reflow.

Figure 25F:
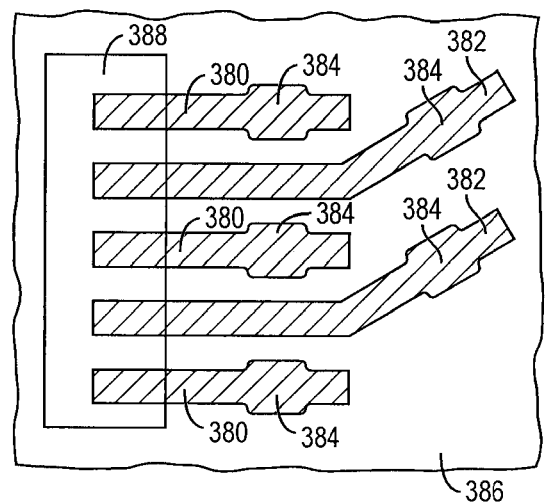

FIG. 25f shows another embodiment of conductive traces 380 and 382 arranged in an array of multiple rows with offset integrated bump pad or interconnect site 384 formed on substrate 386 for maximum interconnect escape routing density and capacity. Alternate conductive traces 380 and 382 include an elbow for routing to bump pads 384. In this case, substrate bump pad 384 is rectangular and wider than conductive traces 380 and 382, but less than the width of the mating interconnect bump material. Masking layer 388 can be formed over a portion of substrate 386; however, masking layer 388 is not formed around substrate bump pad 384 of conductive traces 380 and 382. That is, the portion of conductive trace 380 and 382 designed to mate with the bump material is devoid of any SRO of masking layer 388 that would have been used for bump containment during reflow.

As one example of the interconnect process, semiconductor die 224 is placed over substrate 366 and bump material 234 is aligned with substrate bump pads 364 from FIG. 25d. Bump material 234 is electrically and metallurgically connected to substrate bump pad 364 by pressing the bump material or by bringing the bump material in physical contact with the bump pad and then reflowing the bump material under a reflow temperature, as described for FIGS. 17a-17g, 18a-18d, 19a-19d, 20a-20c, and 21a-21b.

Figure 25G:
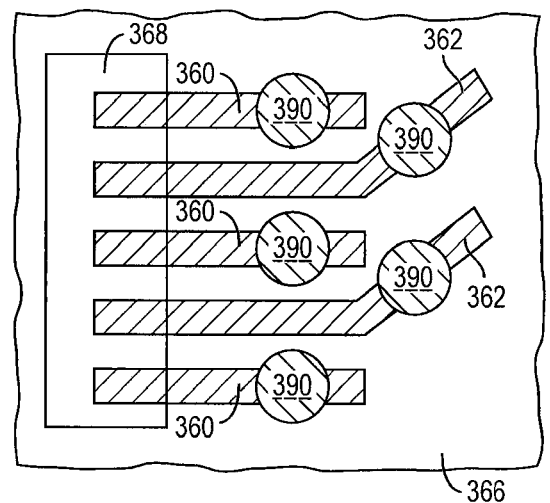

In another embodiment, an electrically conductive bump material is deposited over substrate bump pad 364 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 364 using a suitable attachment or bonding process. In one embodiment, the bump material is reflowed by heating the material above its melting point to form bump or interconnect 390, as shown in FIG. 25g. In some applications, bump 390 is reflowed a second time to improve electrical contact to substrate bump pad 364. The bump material around the narrow substrate bump pad 364 maintains die placement during reflow. Bump material 234 or bumps 390 can also be formed on substrate bump pad configurations of FIGS. 25a-25g.

In high routing density applications, it is desirable to minimize escape pitch of conductive traces 360 and 362 or other conductive trace configurations of FIGS. 25a-25g. The escape pitch between conductive traces 360 and 362 can be reduced by eliminating the masking layer for the purpose of reflow containment, i.e., by reflowing the bump material without a masking layer. Since no SRO is formed around die bump pad 232 or substrate bump pad 364, conductive traces 360 and 362 can be formed with a finer pitch, i.e., conductive traces 360 and 362 can be disposed closer together or to nearby structures. With no SRO around substrate bump pad 364, the pitch between conductive traces 360 and 362 is given as P=D/2+PLT+W/2, wherein D is the base diameter of bump 390, PLT is die placement tolerance, and W is the width of conductive traces 360 and 362. In one embodiment, given a bump base diameter of 100 μm, PLT of 10 μm, and trace line width of 30 μm, the minimum escape pitch of conductive traces 360 and 362 is 125 μm. The mask-less bump formation eliminates the need to account for the ligament spacing of masking material between adjacent openings, SRT, and minimum resolvable SRO, as found in the prior art.

When the bump material is reflowed without a masking layer to metallurgically and electrically connect die bump pad 232 to substrate bump pad 364, the wetting and surface tension causes the bump material to maintain self-confinement and be retained within the space between die bump pad 232 and substrate bump pad 364 and portion of substrate 366 immediately adjacent to conductive traces 360 and 362 substantially within the footprint of the bump pads.

To achieve the desired self-confinement property, the bump material can be immersed in a flux solution prior to placement on die bump pad 232 or substrate bump pad 364 to selectively render the region contacted by the bump material more wettable than the surrounding area of conductive traces 360 and 362. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 368 is not needed around die bump pad 232 or substrate bump pad 364.

Figure 26A:
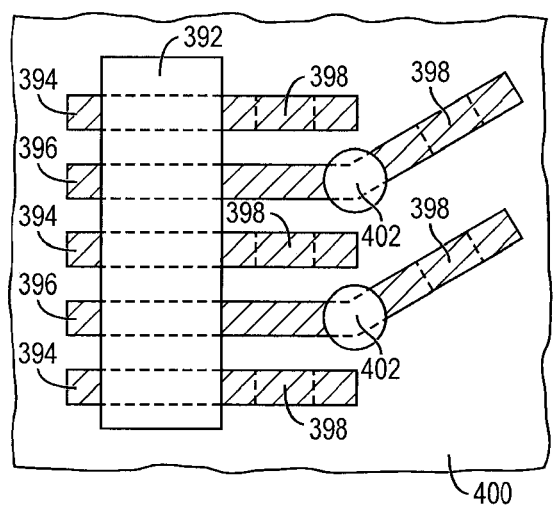
FIGS. 26a-26b illustrate the open solder registration with patches between the conductive traces.

In FIG. 26a, masking layer 392 is deposited over a portion of conductive traces 394 and 396. However, masking layer 392 is not formed over integrated bump pads 398. Consequently, there is no SRO for each bump pad 398 on substrate 400. A non-wettable masking patch 402 is formed on substrate 400 interstitially within the array of integrated bump pads 398, i.e., between adjacent bump pads. The masking patch 402 can also be formed on semiconductor die 224 interstitially within the array of die bump pads 398. More generally, the masking patch is formed in close proximity to the integrated bump pads in any arrangement to prevent run-out to less wettable areas.

Semiconductor die 224 is placed over substrate 400 and the bump material is aligned with substrate bump pads 398. The bump material is electrically and metallurgically connected to substrate bump pad 398 by pressing the bump material or by bringing the bump material in physical contact with the bump pad and then reflowing the bump material under a reflow temperature, as described for FIGS. 17a-17g, 18a-18d, 19a-19d, 20a-20c, and 21a-21b.

Figure 26B:
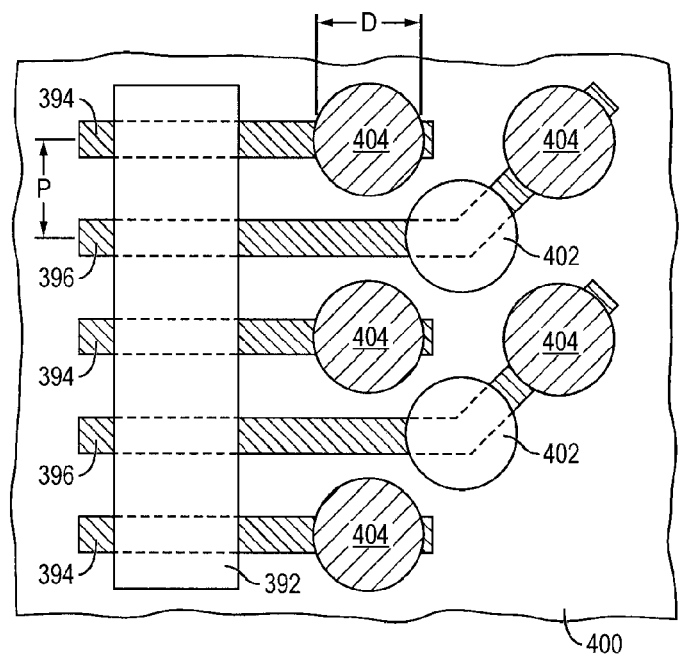

In another embodiment, an electrically conductive bump material is deposited over die integrated bump pads 398 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to integrated bump pads 398 using a suitable attachment or bonding process. In one embodiment, the bump material is reflowed by heating the material above its melting point to form spherical balls or bumps 404, as shown in FIG. 26b. In some applications, bumps 404 are reflowed a second time to improve electrical contact to integrated bump pads 398. The bumps can also be compression bonded to integrated bump pads 398. Bumps 404 represent one type of interconnect structure that can be formed over integrated bump pads 398. The interconnect structure can also use stud bump, micro bump, or other electrical interconnect.

In high routing density applications, it is desirable to minimize escape pitch. In order to reduce the pitch between conductive traces 394 and 396, the bump material is reflowed without a masking layer around integrated bump pads 398. The escape pitch between conductive traces 394 and 396 can be reduced by eliminating the masking layer and associated SROs around the integrated bump pads for the purpose of reflow containment, i.e., by reflowing the bump material without a masking layer. Masking layer 392 can be formed over a portion of conductive traces 394 and 396 and substrate 400 away from integrated bump pads 398; however, masking layer 392 is not formed around integrated bump pads 398. That is, the portion of conductive trace 394 and 396 designed to mate with the bump material is devoid of any SRO of masking layer 392 that would have been used for bump containment during reflow.

In addition, masking patch 402 is formed on substrate 400 interstitially within the array of integrated bump pads 398. Masking patch 402 is non-wettable material. Masking patch 402 can be the same material as masking layer 392 and applied during the same processing step, or a different material during a different processing step. Masking patch 402 can be formed by selective oxidation, plating, or other treatment of the portion of the trace or pad within the array of integrated bump pads 398. Masking patch 402 confines bump material flow to integrated bump pads 398 and prevents leaching of conductive bump material to adjacent structures.

When the bump material is reflowed with masking patch 402 interstitially disposed within the array of integrated bump pads 398, the wetting and surface tension causes the bump material to be confined and retained within the space between die bump pads 232 and integrated bump pads 398 and portion of substrate 400 immediately adjacent to conductive traces 394 and 396 and substantially within the footprint of the integrated bump pads 398.

To achieve the desired confinement property, the bump material can be immersed in a flux solution prior to placement on die bump pads 232 or integrated bump pads 398 to selectively render the region contacted by the bump material more wettable than the surrounding area of conductive traces 394 and 396. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 392 is not needed around die bump pads 232 or integrated bump pads 398.

Since no SRO is formed around die bump pads 232 or integrated bump pads 398, conductive traces 394 and 396 can be formed with a finer pitch, i.e., the conductive traces can be disposed closer to adjacent structures without making contact and forming electrical shorts. Assuming the same solder registration design rule, the pitch between conductive traces 394 and 396 is given as $P=(1.1D+W)/2$, where D is the base diameter of bump 404 and W is the width of conductive traces 394 and 396. In one embodiment, given a bump diameter of 100 μm and trace line width of 20 μm, the minimum escape pitch of conductive traces 394 and 396 is 65 μm. The bump formation eliminates the need to account for the ligament spacing of masking material between adjacent openings and minimum resolvable SRO, as found in the prior art.

Figure 27:
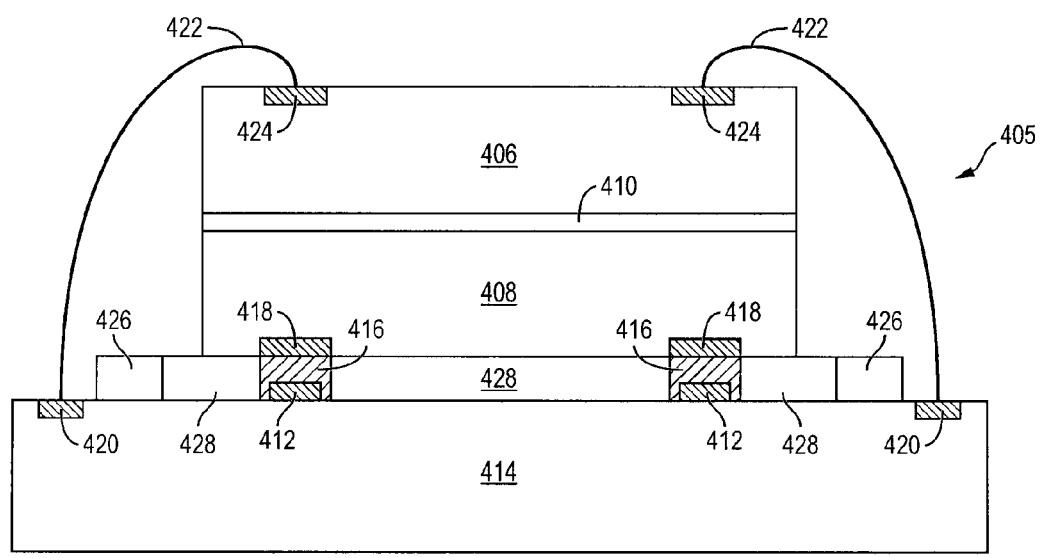
FIG. 27 illustrates a POP with masking layer dam to restrain the encapsulant during mold underfill.

FIG. 27 shows package-on-package (PoP) 405 with semiconductor die 406 stacked over semiconductor die 408 using die attach adhesive 410. Semiconductor die 406 and 408 each have an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 406 and 408 may also contain IPDs, such as inductors, capacitors, and resistors, for RF signal processing.

Semiconductor die 408 is mounted to conductive traces 412 formed on substrate 414 using bump material 416 formed on contact pads 418, using any of the embodiments from FIGS. 17a-17g, 18a-18d, 19a-19d, 20a-20c, and 21a-21b.

Conductive traces 412 are similar to the escape traces and interconnect sites, as described in FIGS. 6-15, for increasing routing density. Semiconductor die 406 is electrically connected to contact pads 420 formed on substrate 414 using bond wires 422. The opposite end of bond wire 422 is bonded to contact pads 424 on semiconductor die 406.

Masking layer 426 is formed over substrate 414 and opened beyond the footprint of semiconductor die 408. While masking layer 426 does not confine bump material 416 to conductive traces 412 during reflow, the open mask can operate as a dam to prevent encapsulant 428 from migrating to contact pads 420 or bond wires 422 during MUF. Encapsulant 428 is deposited between semiconductor die 408 and substrate 414, similar to FIGS. 22a-22c. Masking layer 426 blocks MUF encapsulant 428 from reaching contact pads 420 and bond wires 422, which could cause a defect. Masking layer 426 allows a larger semiconductor die to be placed on a given substrate without risk of encapsulant 428 bleeding onto contact pads 420.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die including a plurality of composite interconnects formed over a surface of the semiconductor die, each one of the composite interconnects including a fusible portion and non-fusible copper column that is exposed with respect to the fusible portion;
    providing a substrate;
    forming a plurality of conductive traces with interconnect sites over the substrate, each interconnect site having a width less than half a width of the composite interconnects;
    bonding the fusible portion of each one of the composite interconnects to each one of the interconnect sites with thermocompression by applying a force to mechanically deform the fusible portion to cover a top surface and side surface of each one of the conductive traces with interconnect sites and then heating the fusible portion of each one of the composite interconnects to a reflow temperature of the fusible portion; and
    depositing an encapsulant around the composite interconnects between the semiconductor die and substrate.

2. The method of claim 1, wherein the fusible portion of the composite interconnects includes tin, lead-free alloy, tin-silver alloy, tin-silver-copper alloy, tin-silver-indium alloy, or eutectic solder.

3. The method of claim 1, wherein the width of each one of the interconnect sites is less than 1.2 times a width of each one of the conductive traces.

4. The method of claim 1, further including forming a masking layer over an area of the substrate away from the interconnect sites.

5. The method of claim 1, wherein the composite interconnects are tapered.

6. A method of making a semiconductor device, comprising:
    providing a semiconductor die including a plurality of composite interconnects formed over a surface of the semiconductor die, the composite interconnects including a fusible portion and non-fusible portion;
    providing a substrate;
    forming a plurality of conductive traces with interconnect sites over the substrate, each interconnect site having a width less than a width of each one of the composite interconnects and less than 1.2 times a width of each one of the conductive traces; and
    bonding each one of the composite interconnects to each one of the interconnect sites so that each one of the composite interconnects covers a top surface and side surface of each one of the conductive traces with each one of the interconnect sites.

7. The method of claim 6, wherein the non-fusible portion of each one of the composite interconnects includes gold, copper, nickel, lead solder, or lead-tin alloy.

8. The method of claim 6, wherein the fusible portion of the composite interconnects includes tin, lead-free alloy, tin-silver alloy, tin-silver-copper alloy, tin-silver-indium alloy, or eutectic solder.

9. The method of claim 6, wherein each one of the composite interconnects includes a bump.

10. The method of claim 6, wherein the width of each one of the interconnect sites is less than half the width of each one of the composite interconnects.

11. The method of claim 6, further including depositing an encapsulant between the semiconductor die and substrate.

12. The method of claim 6, further including bonding the composite interconnects to the interconnect sites with thermocompression by applying a force to mechanically deform the composite interconnects at the top surface and side surface of each one of the interconnect sites and then heating the fusible portion of each one of the composite interconnects to a reflow temperature of the fusible portion.

13. A method of making a semiconductor device, comprising:
    providing a semiconductor die including a plurality of composite interconnects formed over a surface of the semiconductor die, each one of the composite interconnects including,
        (a) a conductive pillar, and
        (b) a bump formed over an end of the conductive pillar to expose a side of the conductive pillar;
    providing a substrate;
    forming a plurality of conductive traces with interconnect sites over the substrate, each interconnect site having a width less than a width of each one of the composite interconnects; and
    bonding each one of the composite interconnects to each one of the interconnect sites so that each one of the composite interconnects covers a top surface and side surface of each one of the conductive traces with each one of the interconnect sites.

14. A method of making a semiconductor device, comprising:
    providing a semiconductor die;
    providing a substrate;
    forming a plurality of conductive traces with interconnect sites over the substrate, wherein a width of each one of the interconnect sites is less than 1.2 times a width of each one of the conductive traces;
    forming a plurality of interconnect structures between the semiconductor die and the interconnect sites on the substrate, the width of each one of the interconnect sites being less than a width of each one of the interconnect structures; and
    bonding each one of the interconnect structures to each one of the interconnect sites so that each one of the interconnect structures covers a top surface and side surface of each one of the conductive traces with each one of the interconnect sites.

15. The method of claim 14, further including depositing an encapsulant between the semiconductor die and substrate.

16. The method of claim 14, wherein each one of the interconnect structures includes a fusible portion and non-fusible portion.

17. The method of claim 16, wherein the non-fusible portion of each one of the interconnect structures includes gold, copper, nickel, lead solder, or lead-tin alloy.

18. The method of claim 16, wherein the fusible portion of the interconnect structures includes tin, lead-free alloy, tin-silver alloy, tin-silver-copper alloy, tin-silver-indium alloy, or eutectic solder.

19. The method of claim 14, wherein each one of the interconnect structures includes:
a conductive pillar; and
a bump formed over the conductive pillar.

20. The method of claim 14, further including bonding the interconnect structures to the interconnect sites with thermocompression by applying a force to mechanically deform the interconnect structures at the top surface and side surface of each one of the interconnect sites and then heating the interconnect structures to a reflow temperature of the interconnect structures.

21. The method of claim 14, further including forming a mold underfill material between the semiconductor die and substrate.

22. The method of claim 14, further including bonding the interconnect structures to the interconnect sites devoid of a masking layer around the interconnect sites.

23. The method of claim 14, further including bonding the interconnect structures to the interconnect sites with a plurality of masking patches disposed over the substrate or semiconductor die.

24. A semiconductor device, comprising:
a semiconductor die;
a substrate;
a plurality of conductive traces with interconnect sites formed over the substrate, wherein a width of each one of the interconnect sites is less than 1.2 times a width of each one of the conductive traces;
a plurality of interconnect structures formed between the semiconductor die and interconnect sites on the substrate, the interconnect structures being bonded to the conductive traces with interconnect sites and each one of the interconnect structures having a width greater than each one of the widths of the interconnect sites; and
an encapsulant deposited between the semiconductor die and substrate.

25. The semiconductor device of claim 24, wherein the interconnect structure includes a non-fusible portion that includes gold, copper, nickel, lead solder, or lead-tin alloy.

26. The semiconductor device of claim 24, wherein the interconnect structure includes a fusible portion that includes tin, lead-free alloy, tin-silver alloy, tin-silver-copper alloy, tin-silver-indium alloy, or eutectic solder.

27. The semiconductor device of claim 24, wherein each one of the widths of the interconnect sites is less than half the width of each one of the interconnect structures.

28. The semiconductor device of claim 24, wherein each one of the interconnect structures covers a top surface and side surface of each one of the interconnect sites.

29. The semiconductor device of claim 24, wherein the width of each one of the interconnect structures across each one of the interconnect sites is less than a length of each one of the interconnect structures along each one of the interconnect sites.

30. The semiconductor device of claim 24, wherein the interconnect structures include a body of bump material and tip extending from the body of bump material.

31. The semiconductor device of claim 24, further including a via formed through the interconnect sites such that the interconnect structures are bonded to the interconnect sites with a portion of the interconnect structures extending into the via.

32. The semiconductor device of claim 24, further including a mold underfill material formed between the semiconductor die and substrate.

33. The semiconductor device of claim 24, wherein the interconnect structures are bonded to the interconnect sites that are devoid of a masking layer around the interconnect sites.

34. The semiconductor device of claim 24, wherein the interconnect structures are bonded to the interconnect sites with a plurality of masking patches disposed over the substrate or semiconductor die.

35. A semiconductor device, comprising:
a semiconductor die;
a substrate;
a plurality of conductive traces with interconnect sites formed over the substrate;
a plurality of interconnect structures formed between the semiconductor die and interconnect sites on the substrate, the interconnect structures being bonded to the conductive traces with interconnect sites and each one of the interconnect structures having a width greater than a width of each one of the interconnect sites, wherein the interconnect structures include:
(a) a conductive pillar, and
(b) a bump formed over an end of the conductive pillar that exposes a side of the conductive pillar; and
an encapsulant deposited between the semiconductor die and substrate.

36. A method of making a semiconductor device, comprising:
providing a semiconductor die;
providing a substrate;
forming a conductive trace including an interconnect site formed over the substrate, wherein a width of the interconnect site is less than 1.2 times a width of the conductive trace;
forming an interconnect structure between the semiconductor die and the interconnect site on the substrate; and
bonding the interconnect structure to the conductive traces with the interconnect site.

37. The method of claim 36, wherein the width of the interconnect site is less than a width of the interconnect structure.

38. The method of claim 36, wherein the interconnect structure includes:
a conductive pillar; and
a bump formed over the conductive pillar.

39. The method of claim 36, wherein the interconnect structure includes a non-fusible portion that includes gold, copper, nickel, lead solder, or lead-tin alloy.

40. The method of claim 36, wherein the interconnect structure includes a fusible portion that includes tin, lead-free alloy, tin-silver alloy, tin-silver-copper alloy, tin-silver-indium alloy, or eutectic solder.

41. The method of claim 36, wherein the interconnect structure covers a top surface and side surface of the interconnect site.

42. The method of claim 36, further including bonding the interconnect structure to the interconnect site with thermocompression by applying a force to mechanically deform the interconnect structure at a top surface of the interconnect site and then heating the interconnect structure to a reflow temperature of the interconnect structure.

43. The method of claim 36, wherein a width of the interconnect structure across the interconnect site is less than a length of the interconnect structure along the interconnect site.

44. The method of claim 36, wherein the interconnect structure or interconnect site includes surface asperities.

45. The method of claim 36, wherein the interconnect structure includes a body of bump material and tip extending from the body of bump material.

46. The method of claim 36, wherein the interconnect site has angled sides.

47. The method of claim 36, further including:
forming a via through the interconnect site; and
bonding the interconnect structure to the interconnect site with a portion of the interconnect structure extending into the via.

48. The method of claim 36, further including forming a mold underfill material between the semiconductor die and substrate.

49. The method of claim 36, further including bonding the interconnect structure to the interconnect site devoid of a masking layer around the interconnect site.

50. The method of claim 36, further including bonding the interconnect structure to the interconnect site with a plurality of masking patches disposed over the substrate or semiconductor die.

51. A method of making a semiconductor device, comprising:
providing a semiconductor die including a plurality of composite interconnects comprising a fusible portion and non-fusible portion formed over a surface of the semiconductor die;
providing a substrate including a plurality of conductive traces formed over the substrate; and
bonding the fusible portion of the composite interconnects to the conductive traces.

52. The method of claim 51, further including bonding the composite interconnects to interconnect sites on the conductive traces, wherein the interconnect sites have a width less than 1.2 times a width of the conductive traces away from the interconnect sites.

53. The method of claim 51, further including:
providing the non-fusible portion of the composite interconnects as a conductive pillar; and
providing the fusible portion of the composite interconnects as a bump formed over the conductive pillar.

54. The method of claim 51, further including bonding the fusible portion of the composite interconnects to a top surface and side surface of the conductive traces.

55. The method of claim 51, further including bonding the fusible portion of the composite interconnects to the conductive traces with thermocompression by applying a force to mechanically deform the composite interconnects at a top surface of the conductive traces and then heating the composite interconnects to a reflow temperature of the composite interconnects.

56. The method of claim 51, further including bonding the composite interconnects to the conductive traces such that a width of the composite interconnects across the conductive traces is less than a length of the composite interconnects along the conductive traces.

57. A method of making a semiconductor device, comprising:
providing a semiconductor die including an interconnect structure comprising a fusible portion and non-fusible portion formed over a surface of the semiconductor die;
providing a substrate including a conductive trace formed over the substrate; and
bonding the fusible portion of the interconnect structure to a top surface and side surface of the conductive trace.

58. The method of claim 57, further including bonding the interconnect structure to an interconnect site on the conductive traces, wherein the interconnect site has a width less than 1.2 times a width of the conductive trace away from the interconnect site.

59. The method of claim 57, further including:
providing the non-fusible portion of the interconnect structure as a conductive pillar; and
providing the fusible portion of the interconnect structure as a bump formed over the conductive pillar.

60. The method of claim 57, further including bonding the fusible portion of the interconnect structure to the conductive trace with thermocompression.

61. The method of claim 57, further including bonding the interconnect structure to the conductive trace such that a width of the interconnect structure across the conductive trace is less than a length of the interconnect structure along the conductive trace.

* * * * *